US012002865B2

(12) United States Patent
Lee

(10) Patent No.: US 12,002,865 B2
(45) Date of Patent: Jun. 4, 2024

(54) INTERCONNECT FEATURES WITH SHARP CORNERS AND METHOD FORMING SAME

(71) Applicant: Taiwan Semiconductor Manufacturing Co., Ltd., Hsinchu (TW)

(72) Inventor: Tze-Liang Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 162 days.

(21) Appl. No.: 17/326,848

(22) Filed: May 21, 2021

(65) Prior Publication Data

US 2022/0310815 A1 Sep. 29, 2022

Related U.S. Application Data

(60) Provisional application No. 63/166,329, filed on Mar. 26, 2021.

(51) Int. Cl.
*H01L 29/423* (2006.01)
*H01L 21/8234* (2006.01)
(Continued)

(52) U.S. Cl.
CPC ............ *H01L 29/42376* (2013.01); *H01L 21/823418* (2013.01); *H01L 21/823431* (2013.01); *H01L 21/823456* (2013.01); *H01L 21/823475* (2013.01); *H01L 27/0886* (2013.01); *H01L 29/401* (2013.01); *H01L 29/41791* (2013.01);
(Continued)

(58) Field of Classification Search
CPC ....... H01L 29/42376; H01L 21/823418; H01L 21/823431; H01L 21/823456; H01L 21/823475; H01L 27/0886; H01L 29/401; H01L 29/41791; H01L 29/4236; H01L 29/66795; H01L 29/785; H01L 21/76816; H01L 21/76883; H01L 23/485; H01L 23/5283; H01L 27/088; H01L 21/823437;
(Continued)

(56) References Cited

U.S. PATENT DOCUMENTS 8,969,923 B2 3/2015 Scheuerlein et al.
10,522,396 B1 12/2019 Cheng et al.
(Continued)

FOREIGN PATENT DOCUMENTS

KR 102111418 B1 5/2020
TW 201126572 A 8/2011
TW 201916100 A 4/2019

Primary Examiner — Cuong B Nguyen
(74) Attorney, Agent, or Firm — Slater Matsil, LLP

(57) ABSTRACT

A method includes depositing a dielectric layer, depositing a plurality of mandrel strips over the dielectric layer, and forming a plurality of spacers on sidewalls of the plurality of mandrel strips to form a plurality of mask groups. Each of the plurality of mandrel strips and two of the plurality of spacers form a mask group in the plurality of mask groups. The method further includes forming a mask strip connecting two neighboring mask groups in the plurality of mask groups, using the plurality of mask groups and the mask strip collectively as an etching mask to etch the dielectric layer and to form trenches in the dielectric layer, and filling a conductive material into the trenches to form a plurality of conductive features.

20 Claims, 34 Drawing Sheets

(51) Int. Cl.
*H01L 27/088* (2006.01)
*H01L 29/40* (2006.01)
*H01L 29/417* (2006.01)
*H01L 29/66* (2006.01)
*H01L 29/78* (2006.01)

(52) U.S. Cl.
CPC .... *H01L 29/4236* (2013.01); *H01L 29/66795* (2013.01); *H01L 29/785* (2013.01)

(58) Field of Classification Search
CPC ......... H01L 21/823481; H01L 21/0337; H01L 21/31144; H01L 21/76877; H01L 23/528
See application file for complete search history.

(56) References Cited

U.S. PATENT DOCUMENTS

| | | |
|---|---|---|
| 10,529,617 B2 | 1/2020 | Liu et al. |
| 2017/0140986 A1 | 5/2017 | Machkaoutsan et al. |
| 2022/0216150 A1* | 7/2022 | Shin .................. H01L 29/42392 |

* cited by examiner

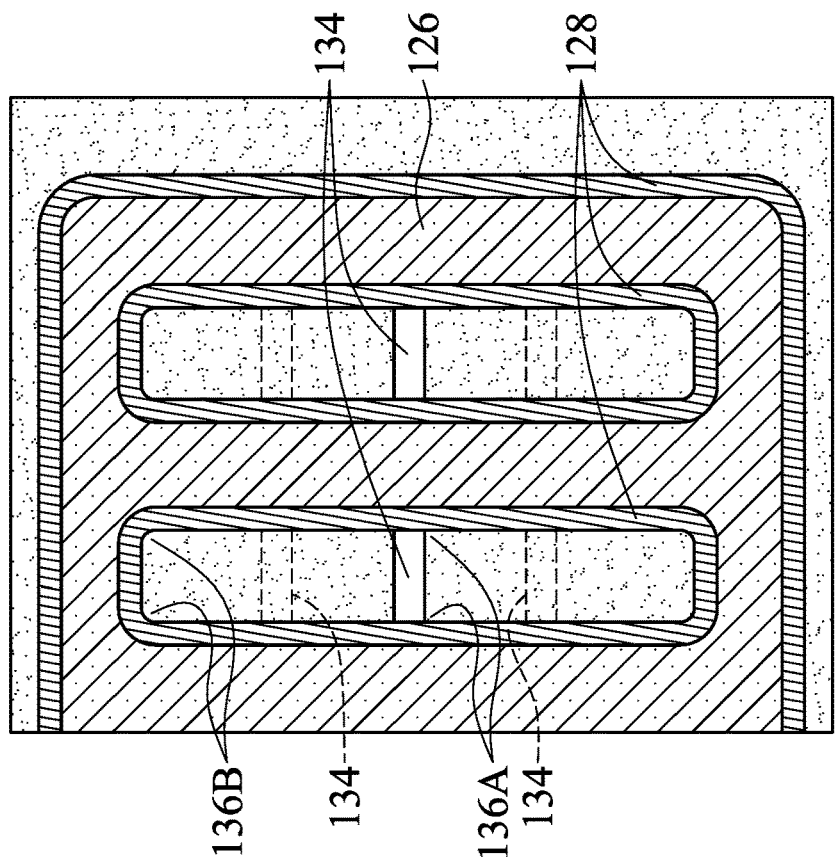
FIG. 30B
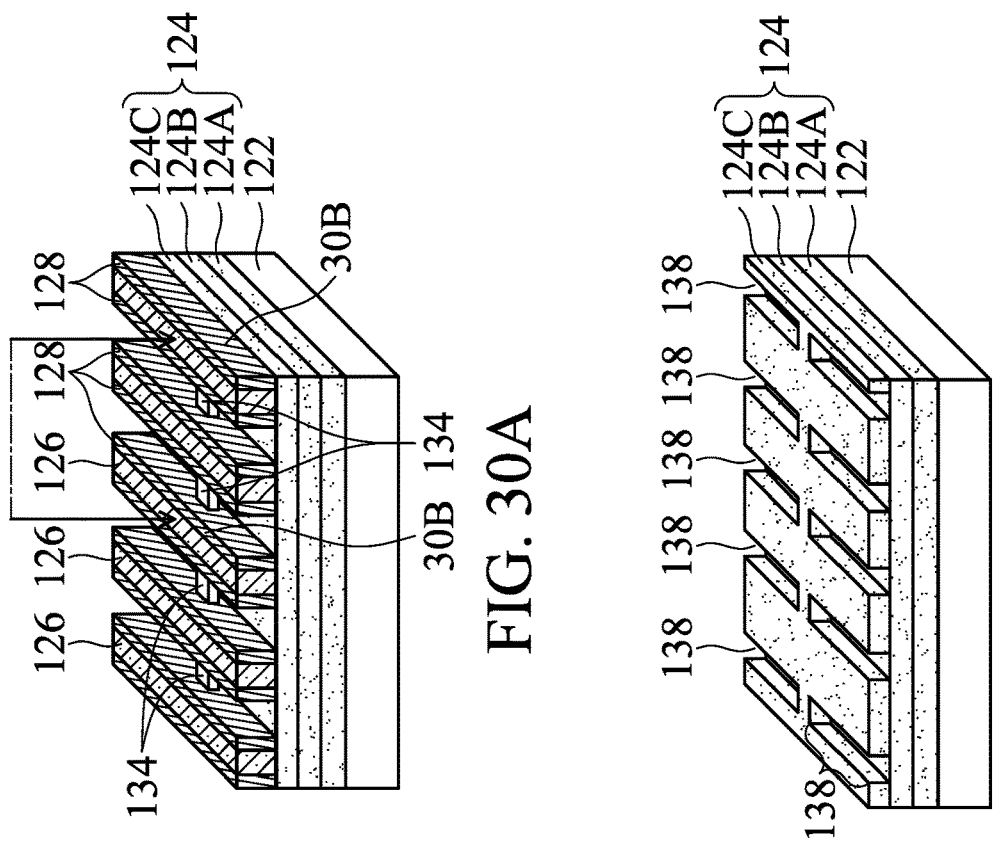
FIG. 30A
FIG. 31

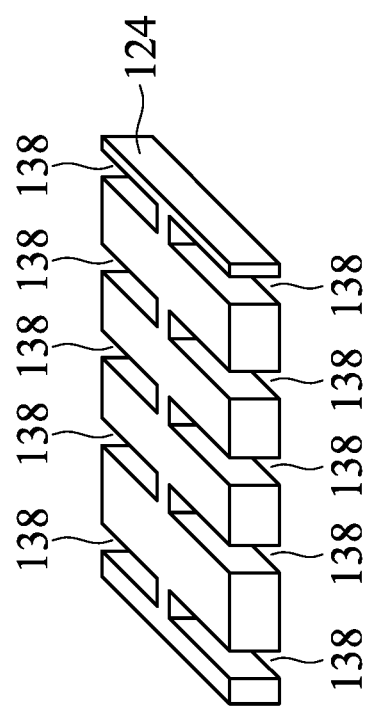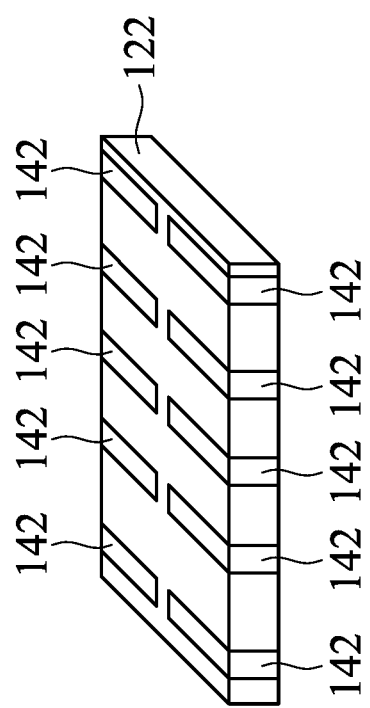
FIG. 32
FIG. 33

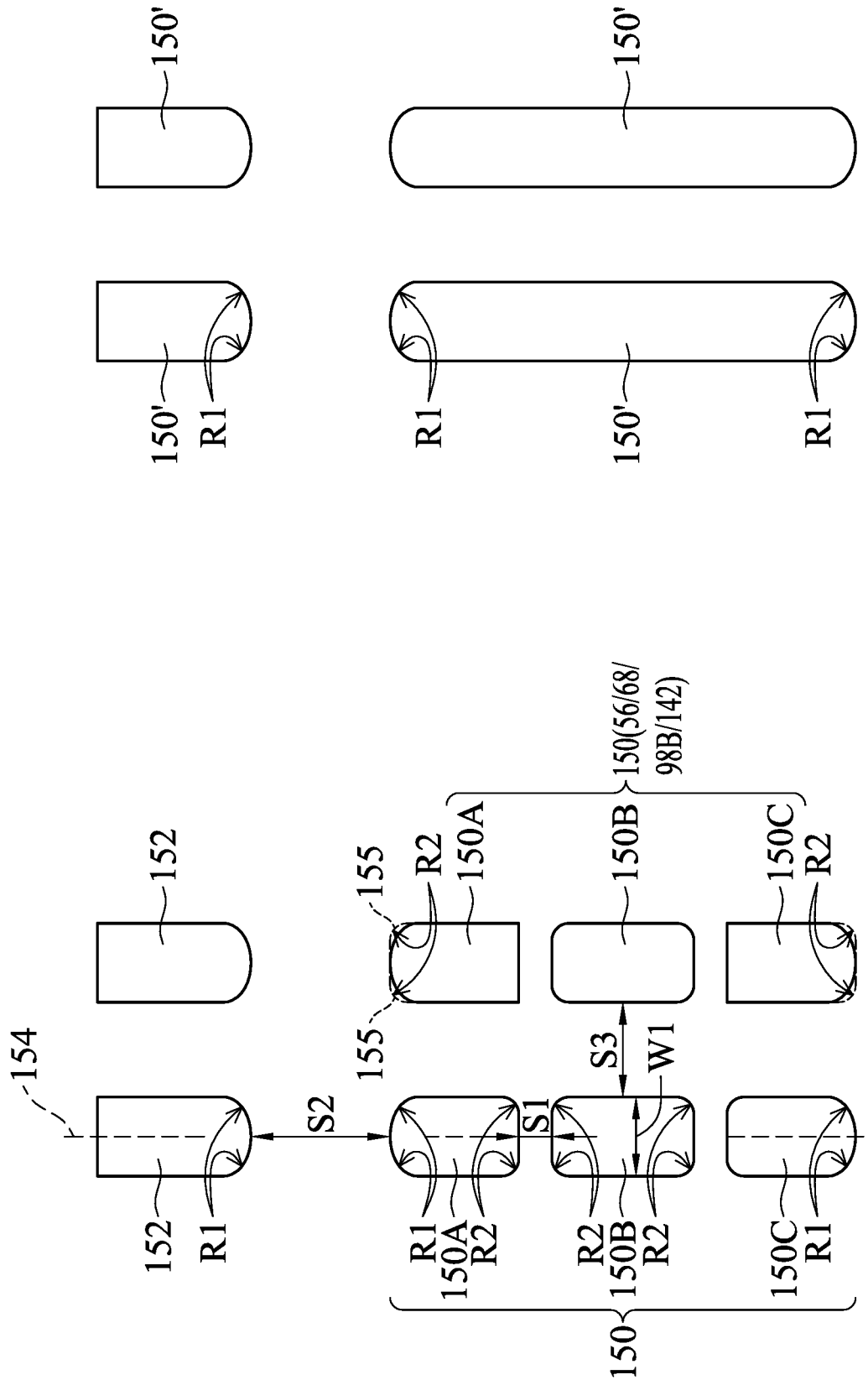

INTERCONNECT FEATURES WITH SHARP CORNERS AND METHOD FORMING SAME

PRIORITY CLAIM AND CROSS-REFERENCE

This application claims the benefit of the following provisionally filed U.S. Patent Application No. 63/166,329, filed on Mar. 26, 2021, and entitled "A Novel Interconnect patterning with Line-End Contact Area Loss <10%," which application is hereby incorporated herein by reference.

BACKGROUND

Metal-Oxide-Semiconductor (MOS) devices are basic building elements in integrated circuits. Recent development of the MOS devices includes forming replacement gates, which include high-k gate dielectrics and metal gate electrodes over the high-k gate dielectrics. The formation of a replacement gate typically involves depositing a high-k gate dielectric layer and metal layers over the high-k gate dielectric layer, and then performing a Chemical Mechanical Polish (CMP) process to remove excess portions of the high-k gate dielectric layer and the metal layers. The remaining portions of the metal layers form the metal gates.

Interconnect features are then formed. For example, source/drain contact plugs and gate plugs are formed to connect to the source/drain regions and metal gates, respectfully. Metal lines and vias are also formed over and connecting to the underlying devices. With the increasing downscaling of the devices, the line-widths of the interconnect features and the spacing between interconnect features became increasingly smaller. Optical proximity effect thus becomes more severe, and the line ends of the interconnect features become rounded. The effective contact areas of the interconnect features available for landing the overlying conductive features are thus reduced, and contact resistance is increased.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 24, 25A, 25B, 26A, 26B, 27-29, 30A, 30B, and 31-33 illustrate the top views and perspective views in the formation of a damascene structure in accordance with some embodiments.

FIGS. 35 and 36 illustrate the shapes of conductive features in accordance with some embodiments.

DETAILED DESCRIPTION

Figure 1:
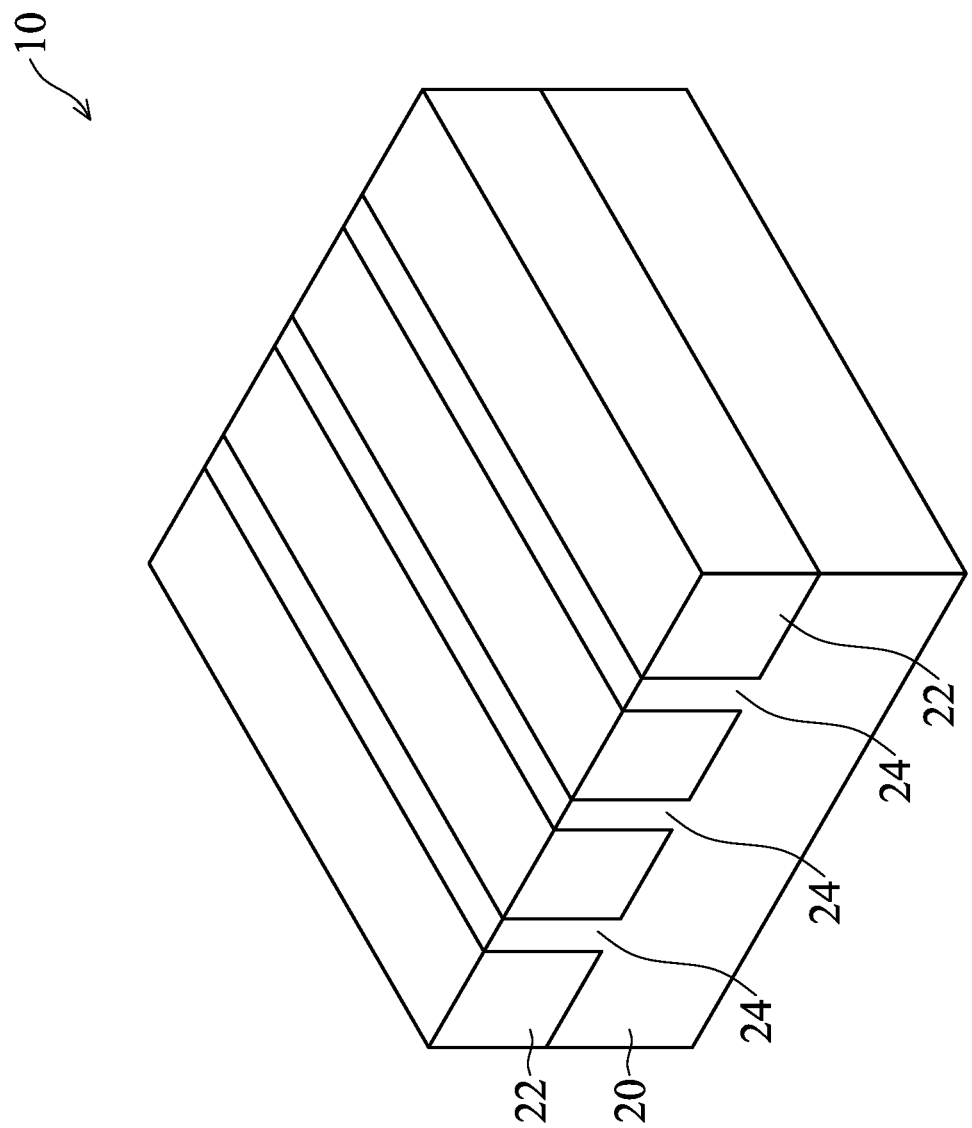
FIGS. 1-8, 12A, 12B, 13A, 13B, 18, 23 and 34 illustrate the perspective views and cross-sectional views in the formation of Fin Field-Effect Transistors (FinFETs) and interconnect features in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs), the corresponding overlying interconnect features, and the method of forming the FinFETs and cutting the corresponding interconnect features are provided. In accordance with some embodiments of the present disclosure, the interconnect features includes metal gates, source/drain contact plugs, metal lines, etc., which are formed first, and are then cut into shorter portions. Through the formation process as provided in the embodiments of the present disclosure, the corners of the conductive features are sharper. It is appreciated that although FinFETs are used as examples, other types of transistors and the corresponding interconnect features are in the scope of the present disclosure. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1-8, 12A, 12B, 13A, 13B, 18, 23 and 34 illustrate the perspective views and cross-sectional views of intermediate stages in the formation of FinFETs and the overlying interconnect features in accordance with some embodiments of the present disclosure. The corresponding processes are also reflected schematically in the process flow shown in FIG. 38.

Figure 38:
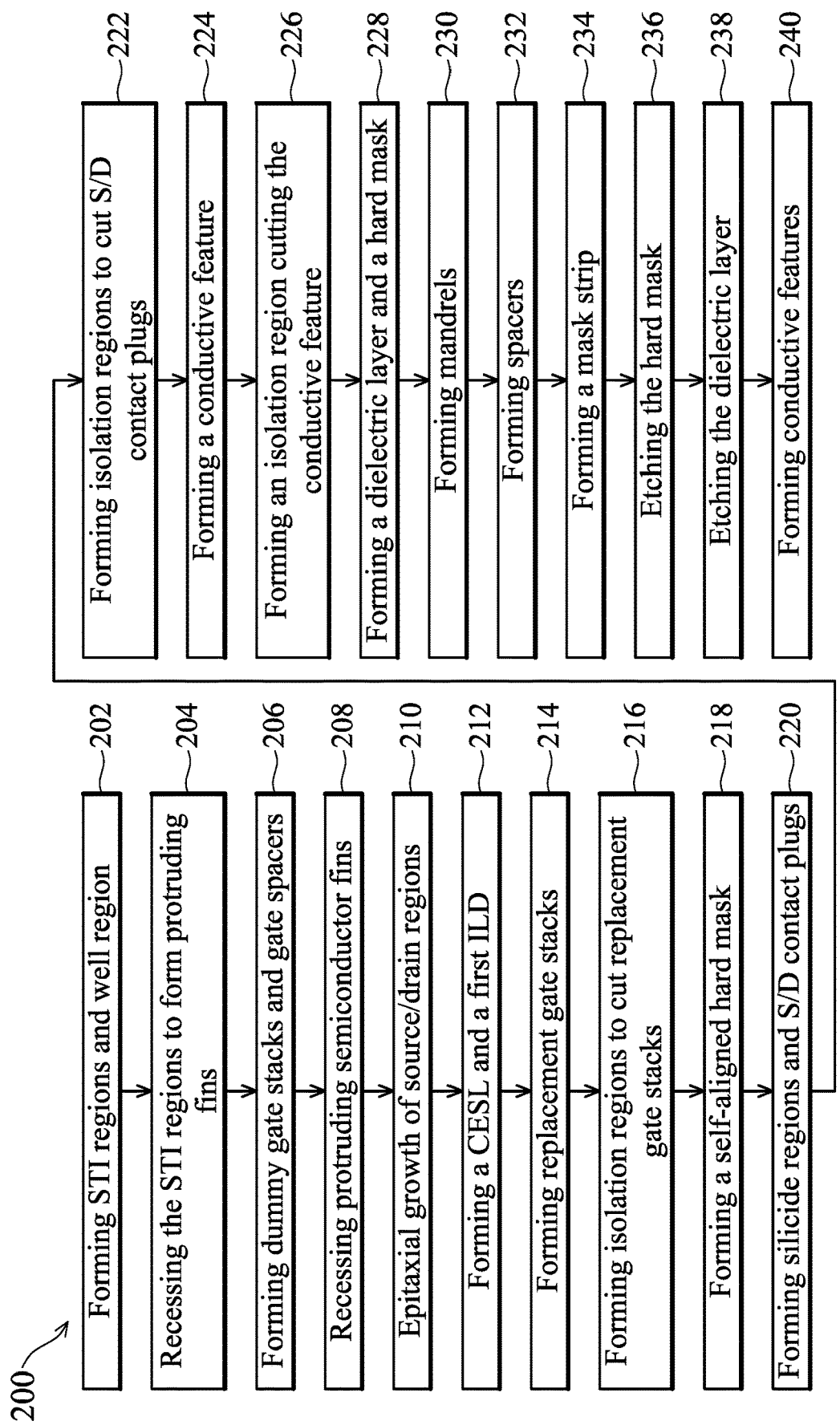
FIG. 38 illustrates a process flow for forming FinFETs and interconnect features in accordance with some embodiments.

FIG. 1 illustrates a perspective view of an initial structure formed on wafer 10. Wafer 10 includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions may be formed to extend from a top surface of substrate 20 into substrate 20. The respective process is illustrated as process 202 in the process flow 200 as shown in FIG. 38. The portions of substrate 20 between neighboring STI regions 22 are referred to as semiconductor strips 24. The top surfaces of semiconductor strips 24 and the top surfaces of STI regions 22 may be substantially level with each other. In accordance with some embodiments of the present disclosure, semiconductor strips 24 are parts of the original substrate 20, and hence the material of semiconductor strips 24 is the same as that of substrate 20. In accordance with alternative embodiments of the present disclosure, semiconductor strips 24 are replacement strips formed by etching the portions of substrate 20 between STI regions 22 to form recesses, and performing an epitaxy process to grow another semiconductor material in the recesses. Accordingly, semiconductor strips 24 are formed of a semiconductor material different from that of substrate 20. In accordance with some embodiments, semiconductor strips 24 are formed of silicon germanium, silicon carbon, or a III-V compound semiconductor material.

STI regions 22 may include a liner oxide (not shown), which may be a thermal oxide layer formed through the thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), Chemical Vapor Deposition (CVD), or the like. STI regions 22 may also include a dielectric material over the liner oxide, wherein the dielectric material may be formed using Flowable Chemical Vapor Deposition (FCVD), spin-on coating, or the like.

Figure 2:
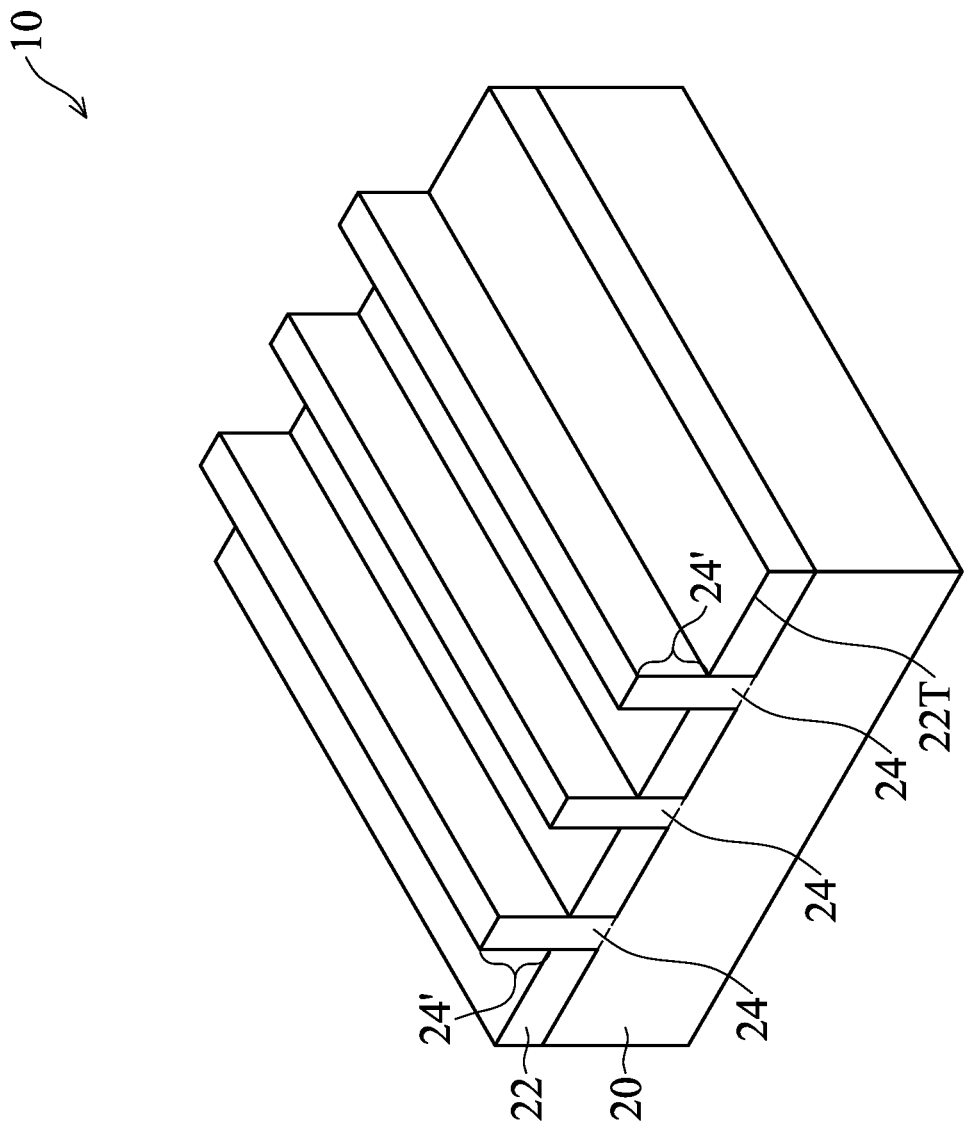

Referring to FIG. 2, STI regions 22 are recessed, so that the top portions of semiconductor strips 24 protrude higher than the top surfaces 22T of the remaining portions of STI regions 22 to form protruding fins 24'. The respective process is illustrated as process 204 in the process flow 200 as shown in FIG. 38. The etching may be performed using a dry etching process, for example, using $NF_3$ and $NH_3$ as the etching gases. In accordance with alternative embodiments of the present disclosure, the recessing of STI regions 22 is performed using a wet etching process. The etching chemical may include diluted HF solution, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 3:
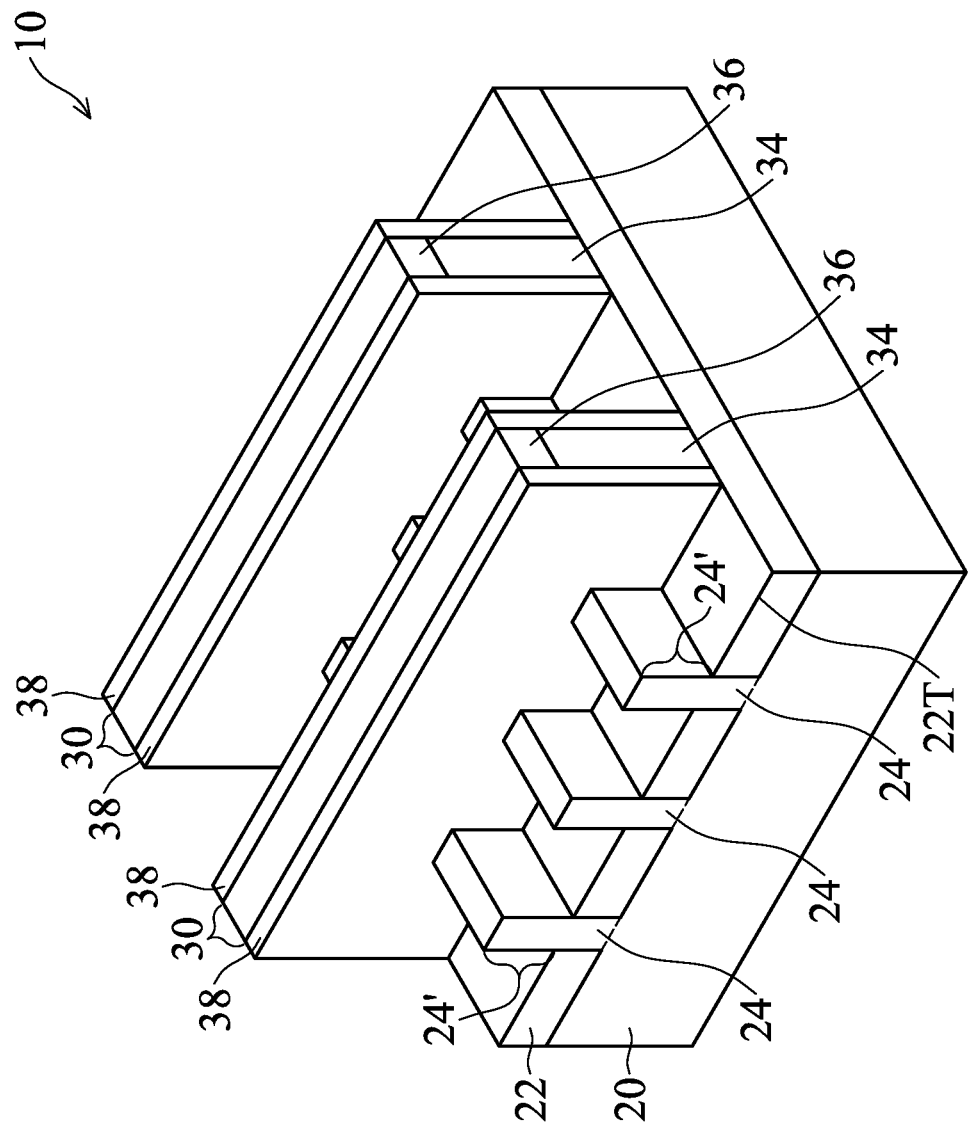

Referring to FIG. 3, dummy gate stacks 30 are formed to extend on the top surfaces and the sidewalls of (protruding) fins 24'. The respective process is illustrated as process 206 in the process flow 200 as shown in FIG. 38. Dummy gate stacks 30 may include dummy gate dielectrics (not shown) on sidewalls of protruding fins 24', and dummy gate electrodes 34 over the respective dummy gate dielectrics. The dummy gate dielectrics may comprise silicon oxide. Dummy gate electrodes 34 may be formed, for example, using polysilicon, and other materials may also be used. Each of dummy gate stacks 30 may also include one (or a plurality of) hard mask layer 36 over the corresponding dummy gate electrodes 34. Hard mask layers 36 may be formed of silicon nitride, silicon oxide, silicon oxy-nitride, or multi-layers thereof. Dummy gate stacks 30 may cross over a single one or a plurality of protruding fins 24' and/or STI regions 22. Dummy gate stacks 30 also have lengthwise directions perpendicular to the lengthwise directions of protruding fins 24'.

Next, gate spacers 38 are formed on the sidewalls of dummy gate stacks 30. The respective process is also illustrated as process 206 in the process flow 200 as shown in FIG. 38. In accordance with some embodiments of the present disclosure, gate spacers 38 are formed of a dielectric material(s) such as silicon nitride, silicon carbo-nitride, or the like, and may have a single-layer structure or a multi-layer structure including a plurality of dielectric layers.

Figure 4:
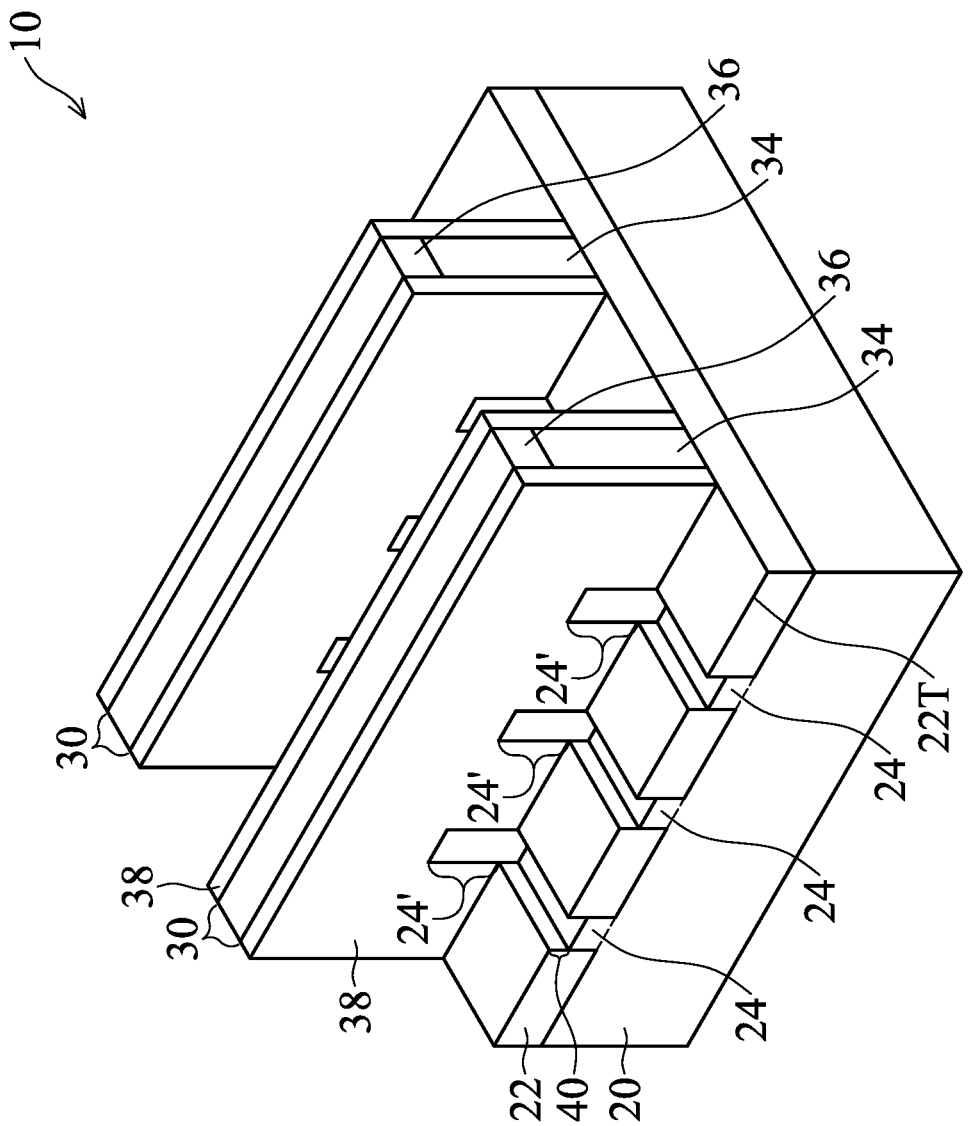

An etching process is then performed to etch the portions of protruding fins 24' that are not covered by dummy gate stack 30 and gate spacers 38, resulting in the structure shown in FIG. 4. The respective process is illustrated as process 208 in the process flow 200 as shown in FIG. 38. The recessing may be anisotropic, and hence the portions of fins 24' directly underlying dummy gate stacks 30 and gate spacers 38 are protected, and are not etched. The top surfaces of the recessed semiconductor strips 24 may be lower than the top surfaces 22T of STI regions 22 in accordance with some embodiments. The spaces left by the etched protruding fins 24' and semiconductor strips 24 are referred to as recesses 40. Recesses 40 are located on the opposite sides of dummy gate stacks 30.

Figure 5:
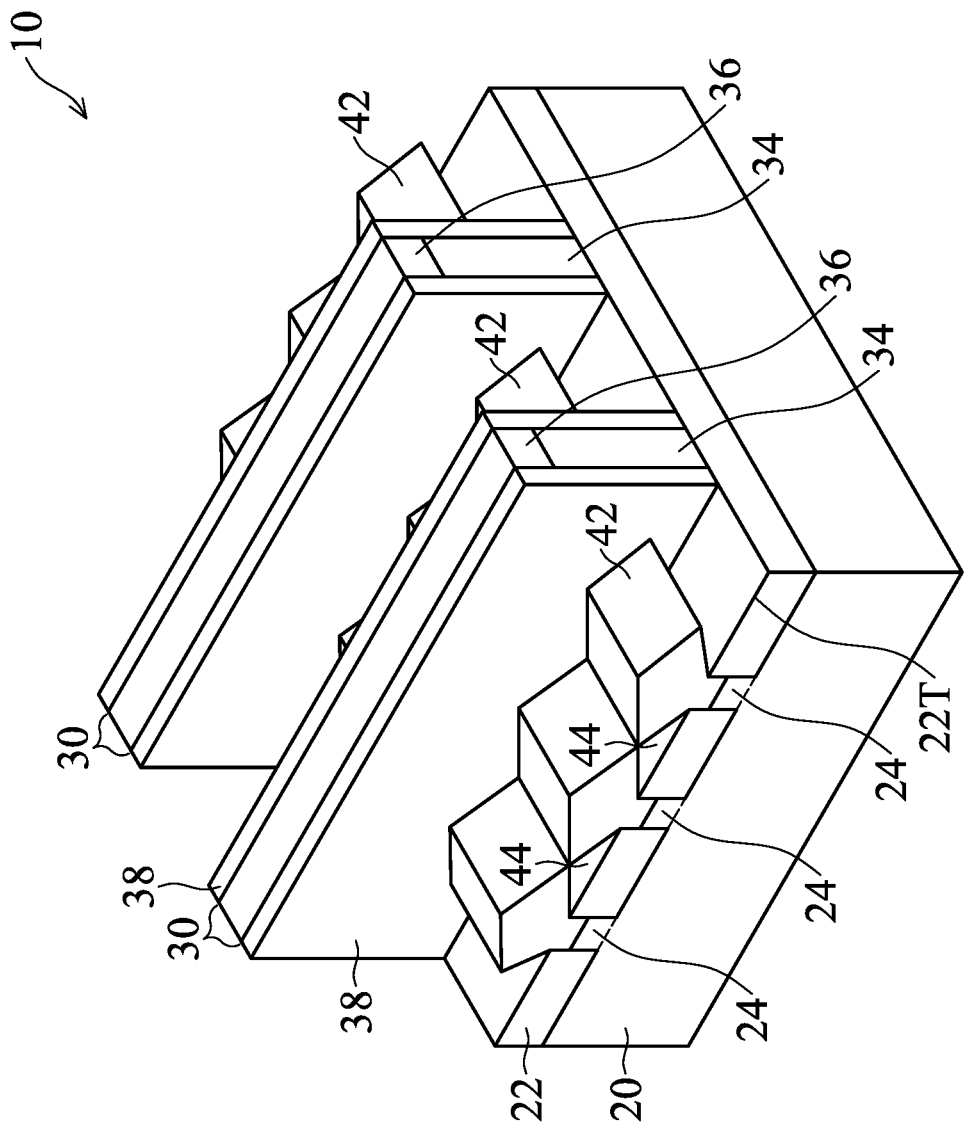
Figure 6:
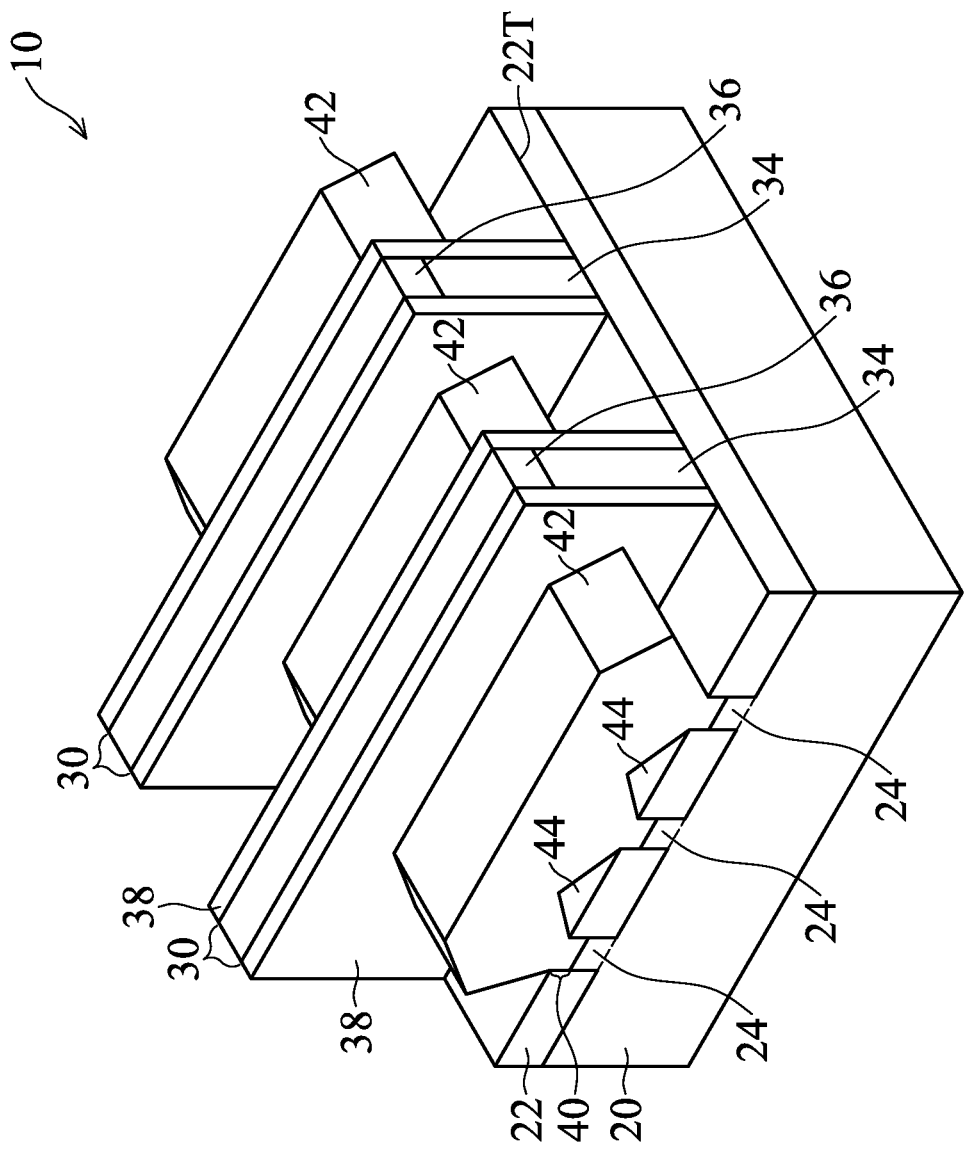

Next, as shown in FIG. 5, epitaxy regions (source/drain regions) 42 are formed by selectively growing (through epitaxy) a semiconductor material in recesses 40. The respective process is illustrated as process 210 in the process flow 200 as shown in FIG. 38. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), silicon boron (SiB), or the like may be grown. Conversely, when the resulting FinFET is an n-type FinFET, silicon phosphorous (SiP), silicon carbon phosphorous (SiCP), or the like may be grown. In accordance with alternative embodiments of the present disclosure, epitaxy regions 42 comprise III-V compound semiconductors such as GaAs, InP, GaN, InGaAs, InAlAs, GaSb, AlSb, AlAs, AlP, GaP, combinations thereof, or multi-layers thereof. After Recesses 40 are filled with epitaxy regions 42, the further epitaxial growth of epitaxy regions 42 causes epitaxy regions 42 to expand horizontally, and facets may be formed. The further growth of epitaxy regions 42 may also cause neighboring epitaxy regions 42 to merge with each other. Voids (air gaps) 44 may be generated. In accordance with some embodiments of the present disclosure, the formation of epitaxy regions 42 may be finished when the top surface of epitaxy regions 42 is still wavy, or when the top surface of the merged epitaxy regions 42 has become planar, which is achieved by further growing on the epitaxy regions 42 as shown in FIG. 6.

After the epitaxy process, epitaxy regions 42 may be further implanted with a p-type or an n-type impurity to form source and drain regions, which are also denoted using reference numeral 42. In accordance with alternative embodiments of the present disclosure, the implantation process is skipped when epitaxy regions 42 are in-situ doped with the p-type or n-type impurity during the epitaxy.

Figure 7:
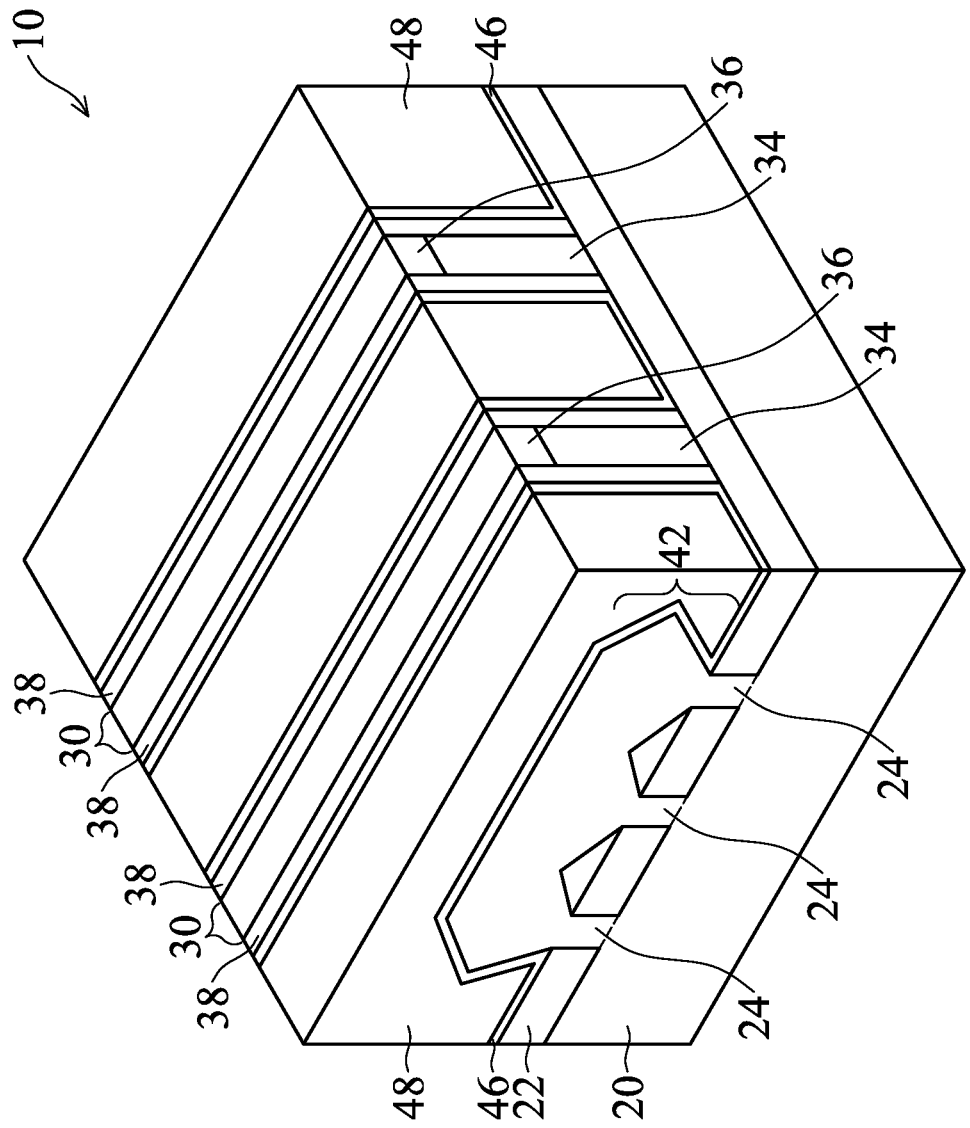

FIG. 7 illustrates a perspective view of the structure after the formation of Contact Etch Stop Layer (CESL) 46 and Inter-Layer Dielectric (ILD) 48. The respective process is illustrated as process 212 in the process flow 200 as shown in FIG. 38. CESL 46 may be formed of silicon oxide, silicon nitride, silicon carbo-nitride, or the like, and may be formed using CVD, ALD, or the like. ILD 48 may include a dielectric material formed using, for example, FCVD, spin-on coating, CVD, or another deposition process. ILD 48 may be formed of an oxygen-containing dielectric material, which may be a silicon-oxide based dielectric material such as silicon oxide (formed using Tetra Ethyl Ortho Silicate (TEOS) as a process gas, for example), Phospho-Silicate Glass (PSG), Boro-Silicate Glass (BSG), Boron-Doped Phospho-Silicate Glass (BPSG), or the like. A planarization process such as a Chemical Mechanical Polish (CMP) process or a mechanical grinding process may be performed to level the top surfaces of ILD 48, dummy gate stacks 30, and gate spacers 38 with each other.

Figure 8:
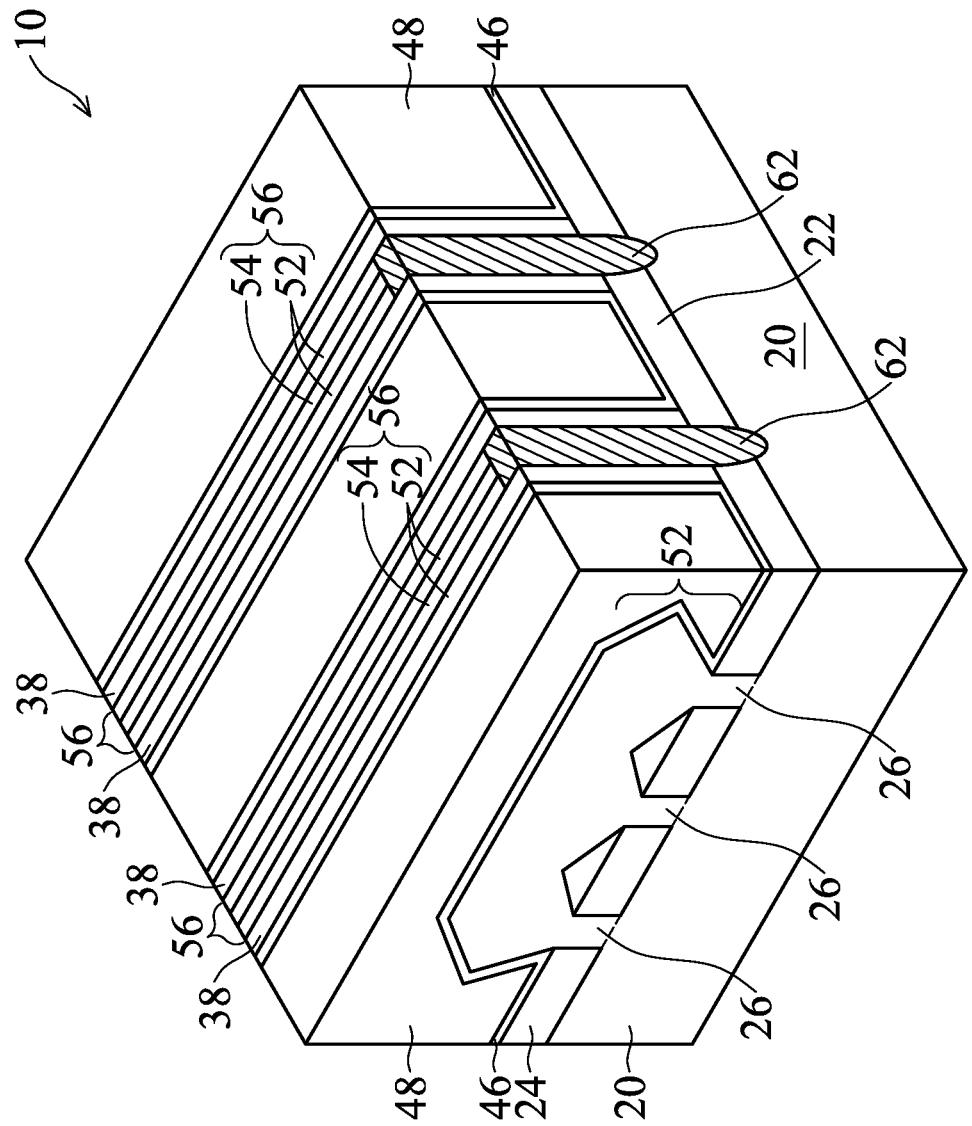

Next, dummy gate stacks 30, which include hard mask layers 36, dummy gate electrodes 34, and the dummy gate dielectrics are replaced with replacement gate stacks 56, which include metal gate electrodes 54 and gate dielectrics 52 as shown in FIG. 8. The respective process is illustrated as process 214 in the process flow 200 as shown in FIG. 38. When forming replacement gate stacks 56, hard mask layers 36, dummy gate electrodes 34 (as shown in FIG. 7), and the dummy gate dielectrics are first removed in one or a plurality of etching processes, resulting in trenches/openings to be formed between gate spacers 38. The top surfaces and the sidewalls of protruding semiconductor fins 24' are exposed to the resulting trenches.

Next, as shown in FIG. 8, which illustrate a perspective view, replacement gate dielectric layers 52 are formed, which extend into the trenches between gate spacers 38. In accordance with some embodiments of the present disclosure, each of gate dielectric layers 52 includes an Interfacial Layer (IL) 52' (FIG. 12B) as its lower part, which contacts the exposed surfaces of the corresponding protruding fins 24'. The IL 52' may include an oxide layer such as a silicon oxide layer, which is formed through the thermal oxidation of protruding fins 24', a chemical oxidation process, or a deposition process. Gate dielectric layer 52 may also include a high-k dielectric layer 52" formed over IL 52'. The high-k dielectric layer 52" may include a high-k dielectric material such as hafnium oxide, lanthanum oxide, aluminum oxide, zirconium oxide, silicon nitride, or the like. The dielectric constant (k-value) of the high-k dielectric material is higher than 3.9, and may be higher than about 7.0. The high-k dielectric layer is formed as a conformal layer, and extends on the sidewalls of protruding fins 24' and the sidewalls of gate spacers 38. In accordance with some embodiments of the present disclosure, the high-k dielectric layer is formed using ALD or CVD.

Referring further to FIG. 8, gate electrodes 54 (also shown in FIG. 12B) are formed on gate dielectrics 52. Gate electrodes 54 include stacked conductive layers. The layers in the stacked conductive layers are not shown separately, while the stacked conductive layers may be distinguishable from each other. The stacked conductive layers may be deposited using a conformal deposition method(s) such as ALD or CVD. The stacked conductive layers may include a diffusion barrier layer (also sometimes referred to as a glue layer) and one (or more) work-function layer over the diffusion barrier layer. The diffusion barrier layer may be formed of or comprises titanium nitride (TiN), which may (or may not) be doped with silicon. The work-function layer determines the work function of the gate, and includes at least one layer, or a plurality of layers formed of different materials. The material of the work-function layer is selected according to whether the respective FinFET is an n-type FinFET or a p-type FinFET. For example, when the FinFET is an n-type FinFET, the work-function layer may include a TaN layer and a titanium aluminum (TiAl) layer over the TaN layer. When the FinFET is a p-type FinFET, the work-function layer may include a TaN layer and a TiN layer over the TaN layer. After the deposition of the work-function layer(s), a glue layer, which may be another TiN layer, is formed. The glue layer may or may not fully fill the trenches left by the removed dummy gate stacks.

The deposited gate dielectric layers and conductive layers are formed as conformal layers extending into the trenches, and include some portions over ILD 48. Next, if the glue layer does not fully fill the trenches, a metallic material is deposited to fill the remaining trenches. The metallic material may be formed of or comprise tungsten or cobalt, for example. Subsequently, a planarization process such as a CMP process or a mechanical grinding process is performed, so that the portions of the gate dielectric layers, stacked conductive layers, and the metallic material over ILD 48 are removed. As a result, gate electrodes 54 and gate dielectrics 52 are formed. Gate electrodes 54 and gate dielectrics 52 are collectively referred to as replacement gate stacks 56. The top surfaces of replacement gate stacks 56, gate spacers 38, CESL 46, and ILD 48 may be substantially coplanar at this time.

After the formation, gate stacks 56 are cut into shorter gate stacks, with dielectric isolation regions 62 being formed to electrically isolate the shorter gate stacks 56 from each other. The respective process is illustrated as process 216 in the process flow 200 as shown in FIG. 38. The shorter gate stacks may belong to different FinFETs. FIGS. 9A, 9B, 9C, 10A, 10B, 10C, 11A, 11B, 11C, 12A, 12B, 12C, 13A, 13B, and 13C illustrate the top views and the perspective views in the cutting of metal gates in accordance with some embodiments. The figure number of each of these figures includes letter "A," "B," or "C." The letter "A" indicates that the respective figure shows a top view. The letter "B" indicates that the respective figure shows the reference cross-section "B-B" in the respective top view. The letter "C" indicates that the respective figure shows the reference cross-section "C-C" in the respective top view.

Figure 9B:
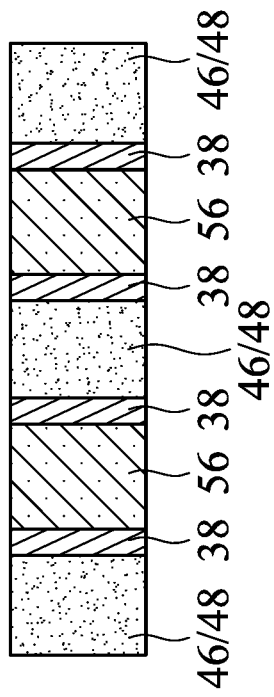
FIGS. 9A, 9B, 9C, 10A, 10B, 10C, 11A, 11B, and 11C illustrate the top views and perspective views in the cutting of metal gates in accordance with some embodiments.
Figure 9C:
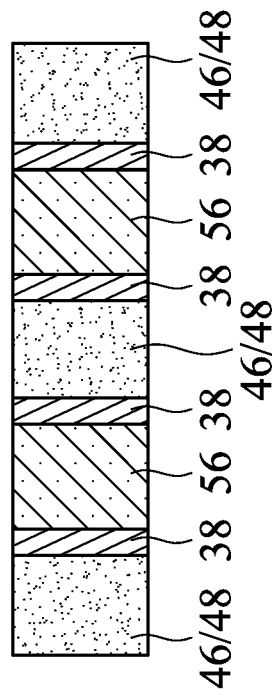
Figure 9A:
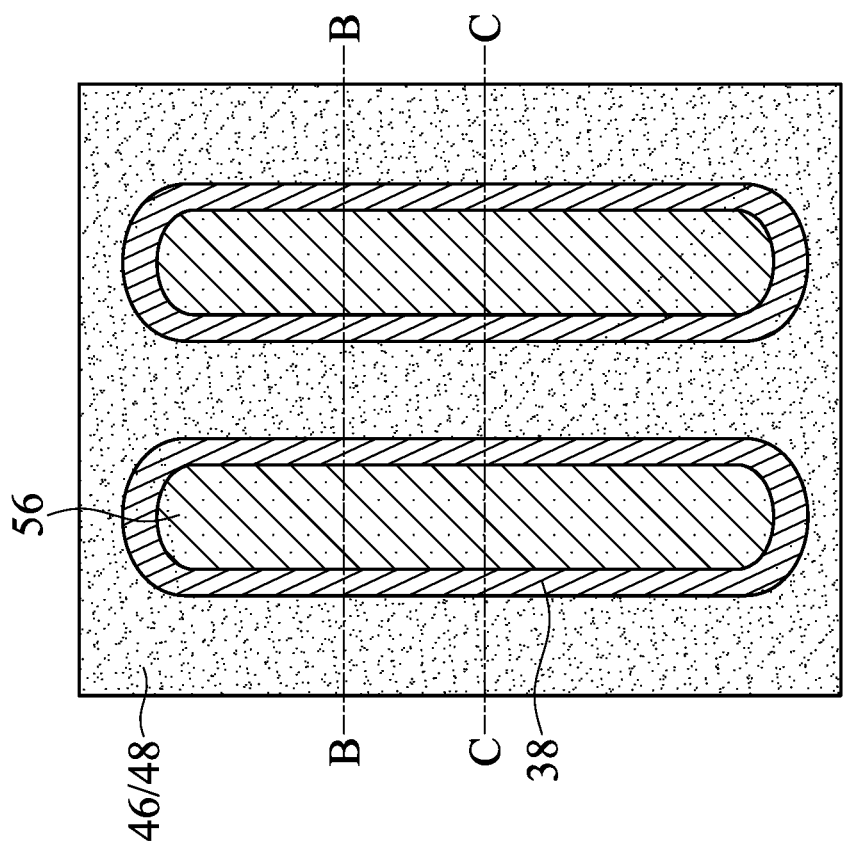

Referring to FIG. 9A, the top view of two gate stacks 56 and the corresponding gate spacers 38 are illustrated. Gate stacks 56 and gate spacers 38 are surrounded by CESL 46 and ILD 48. In accordance with some embodiments, due to the small spacing and small width of gate stacks, the end portions of gate stacks are rounded. FIGS. 9B and 9C illustrate the cross-sectional views obtained from reference cross-sections B-B and C-C, respectively, in FIG. 9A. The details of gate stacks are not shown in detail, and may be found referring to FIG. 8.

Figure 10B:
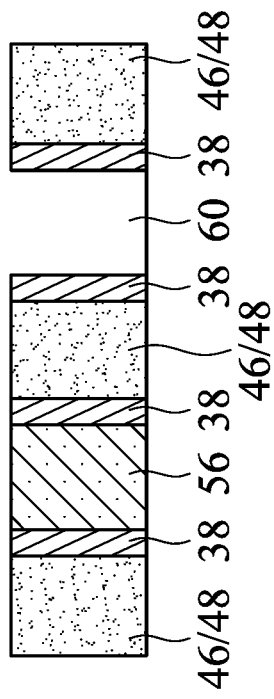
Figure 10C:
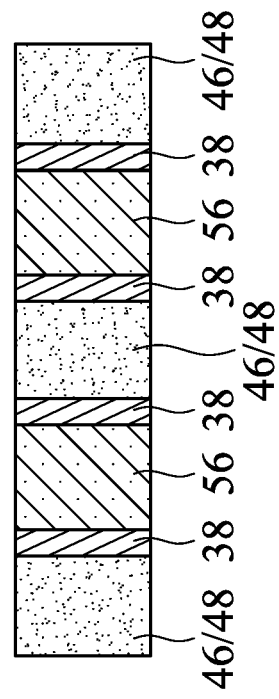
Figure 10A:
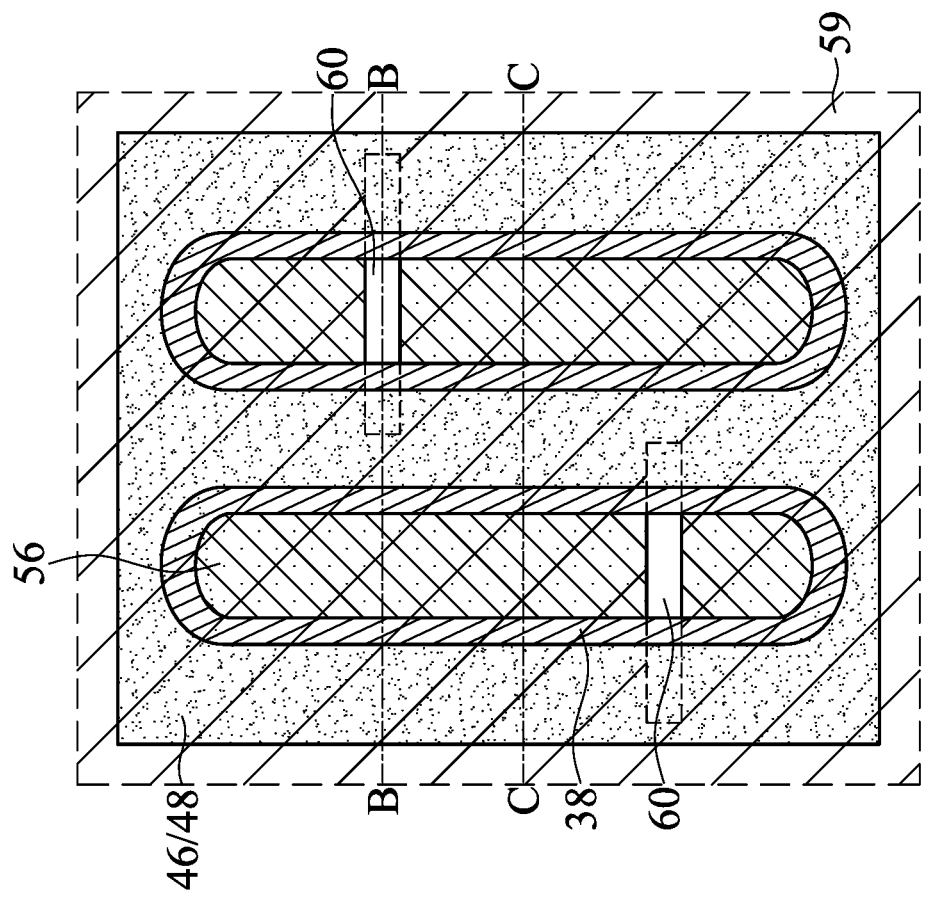

Referring to FIGS. 10A, 10B, and 10C, gate stacks 56 are cut in a lithography process, in which an etching mask 59 (such as a photo resist, shown in FIG. 10A) is formed, and gate stacks 56 are etched to form openings 60. The cutting is performed by using an etching mask 59 (such as a photo resist), which define the patterns of openings 60. The openings in etching mask 59 may extend laterally beyond the edges of gate stacks 56 (rather than flush with the edge of gate spacers 38) in order to reduce line-end rounding. The separated portions of the original same gate stack 56 are electrically disconnected from each other by the cutting process. Openings 60 may extend into and stopped in the underlying STI regions 22, or may further extend into the underlying substrate 20. For example, FIG. 8 illustrates that dielectric isolation regions 62 (which fills openings 60) extend into semiconductor substrate 20. In accordance with some embodiments, the etching gases are selected so that gate spacers 38, CESL 46, and ILD 48 are not etched, and openings 60 are limited between opposing portions of gate spacers 38. In accordance with alternative embodiments, gate spacers 38 and possibly CESL 46 and ILD 48 are also etched, and openings 60 extend into gate spacers 38, and may, or may not, extend into CESL 46 and ILD 48.

Figure 11B:
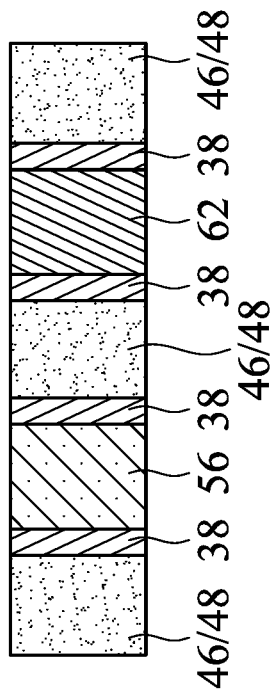
Figure 11C:
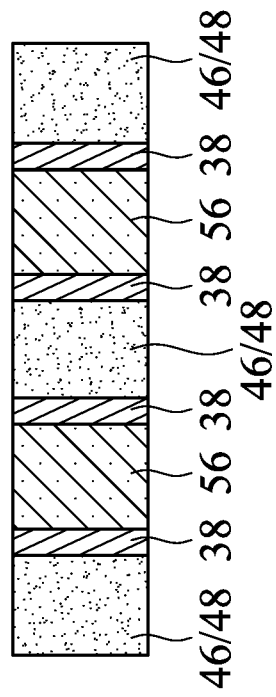
Figure 11A:
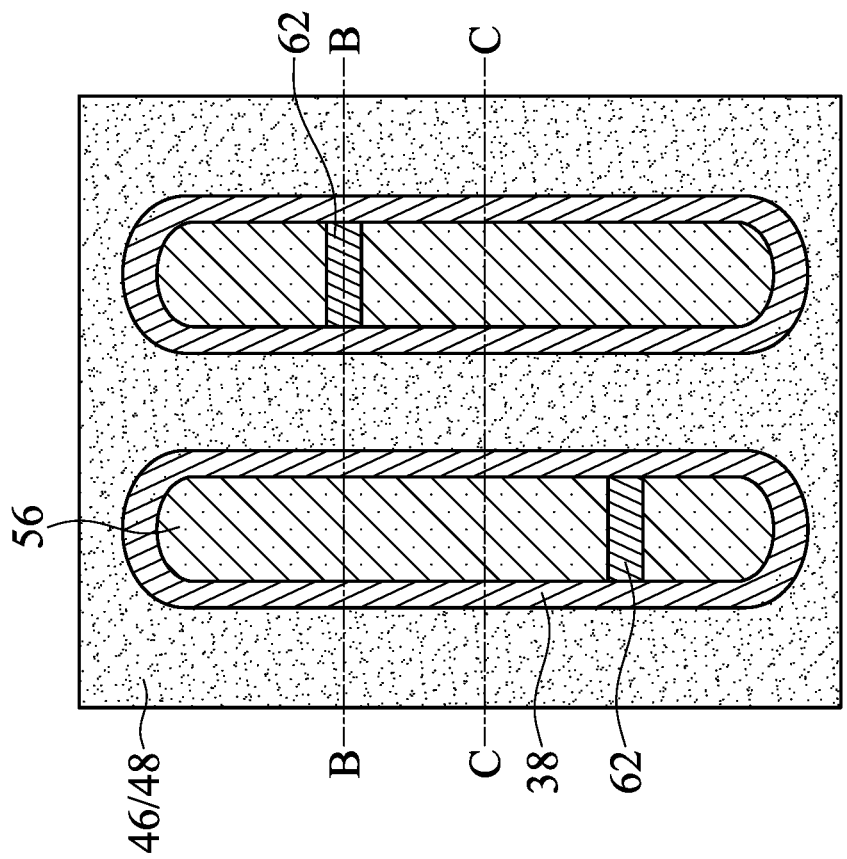

Referring to FIGS. 11A, 11B, and 11C, gate isolation regions 62 are formed to fill openings 60. In accordance with some embodiments, the formation process may include depositing a dielectric material such as silicon nitride, silicon oxide, silicon oxycarbide, silicon oxynitride, or the like, and then performing a planarization process such as a CMP process or a mechanical polish process to remove excess portions of the dielectric material.

Figure 12A:
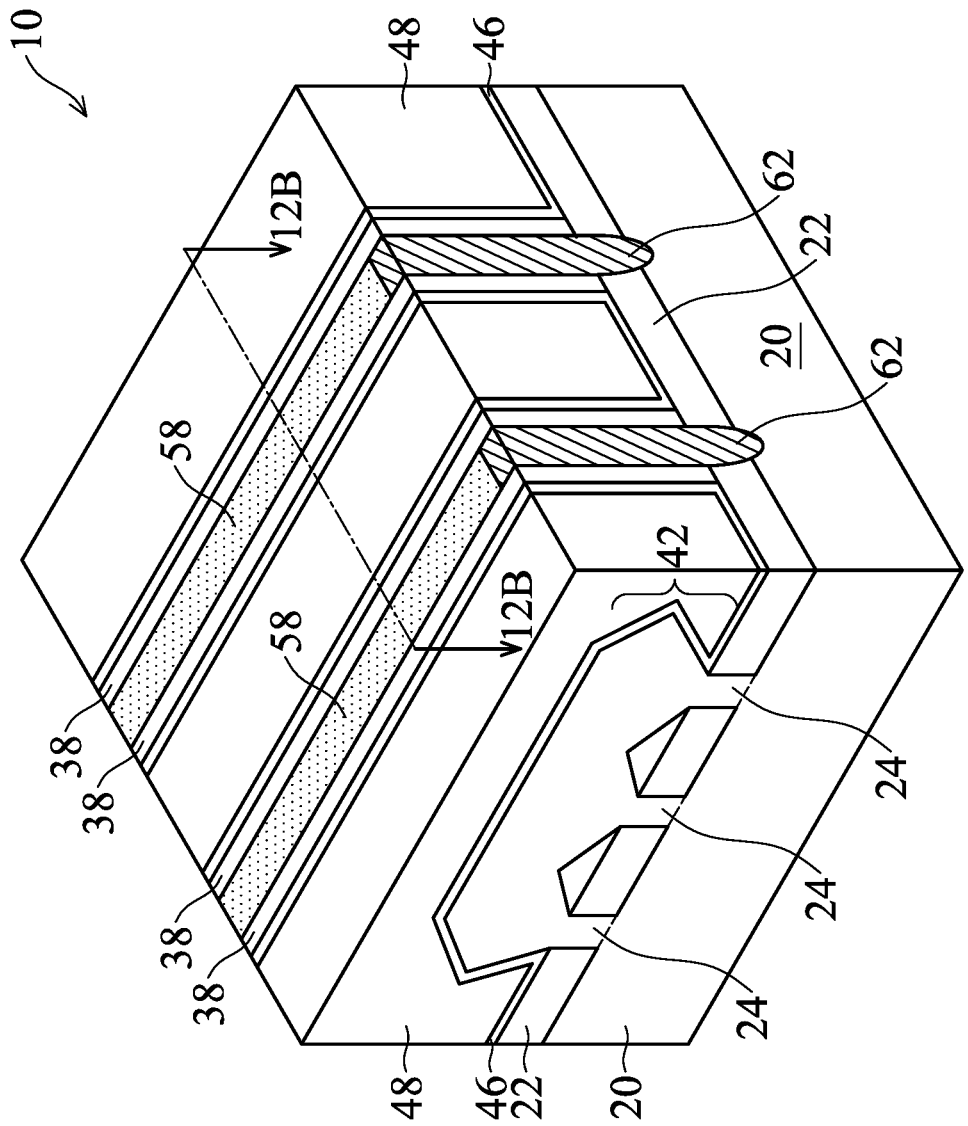
Figure 12B:
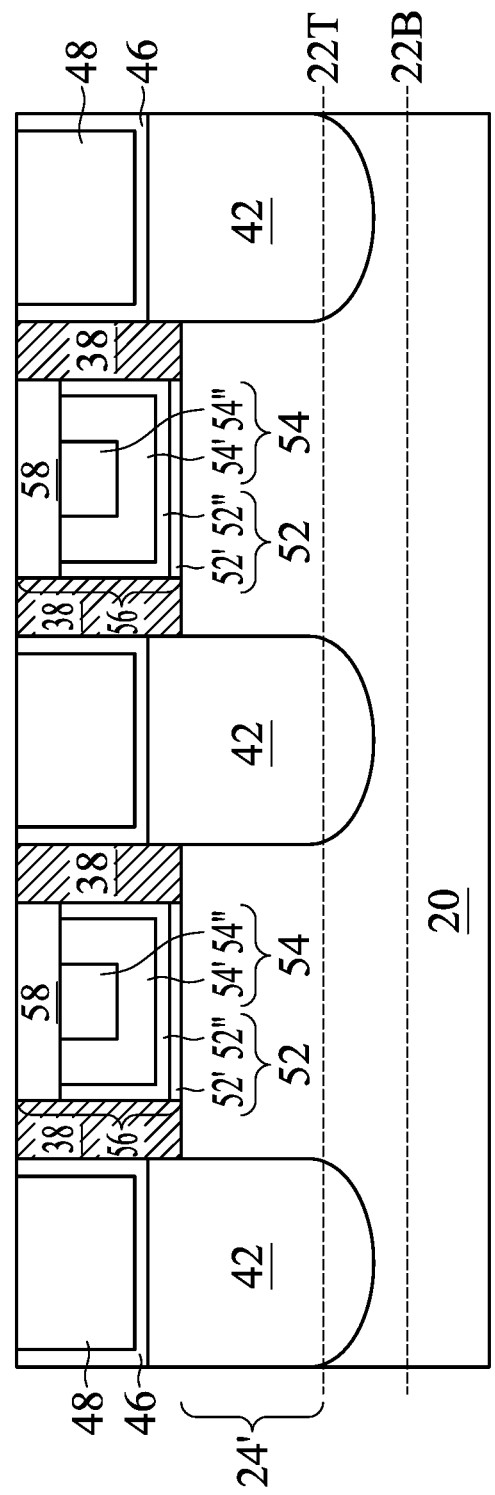

FIGS. 12A and 12B illustrate the formation of (self-aligned) hard masks 58 in accordance with some embodiments, wherein FIG. 12B illustrates the reference cross-section 12B-12B in FIG. 12A. The respective process is illustrated as process 218 in the process flow 200 as shown in FIG. 38. The formation of hard masks 58 may include performing an etching process to recess gate stacks 56, so that recesses are formed between gate spacers 38, filling the recesses with a dielectric material, and then performing a planarization process such as a CMP process or a mechanical grinding process to remove excess portions of the dielectric material. Hard masks 58 may be formed of silicon nitride, silicon oxy-nitride, silicon oxy-carbo-nitride, or the like.

Figure 13A:
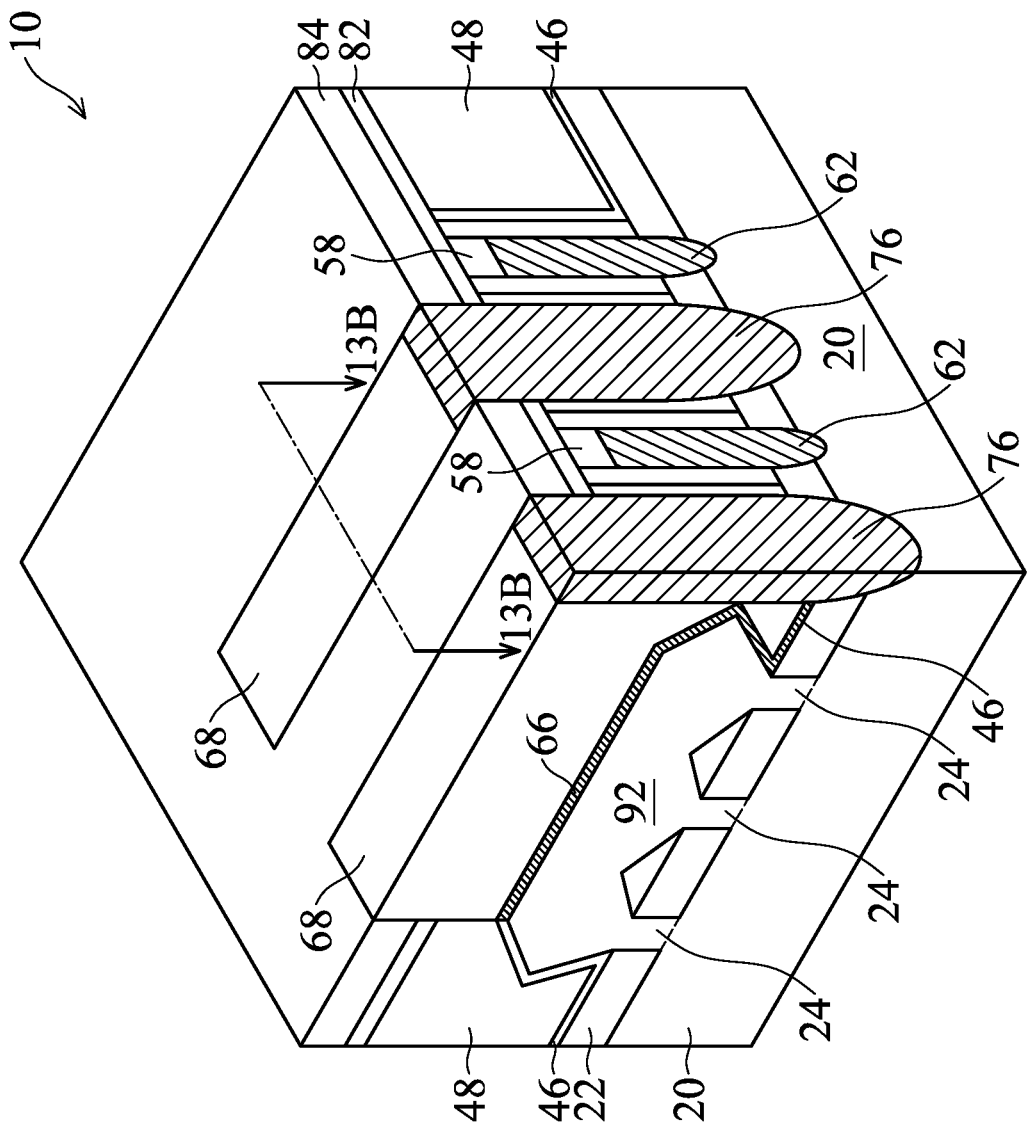
Figure 13B:
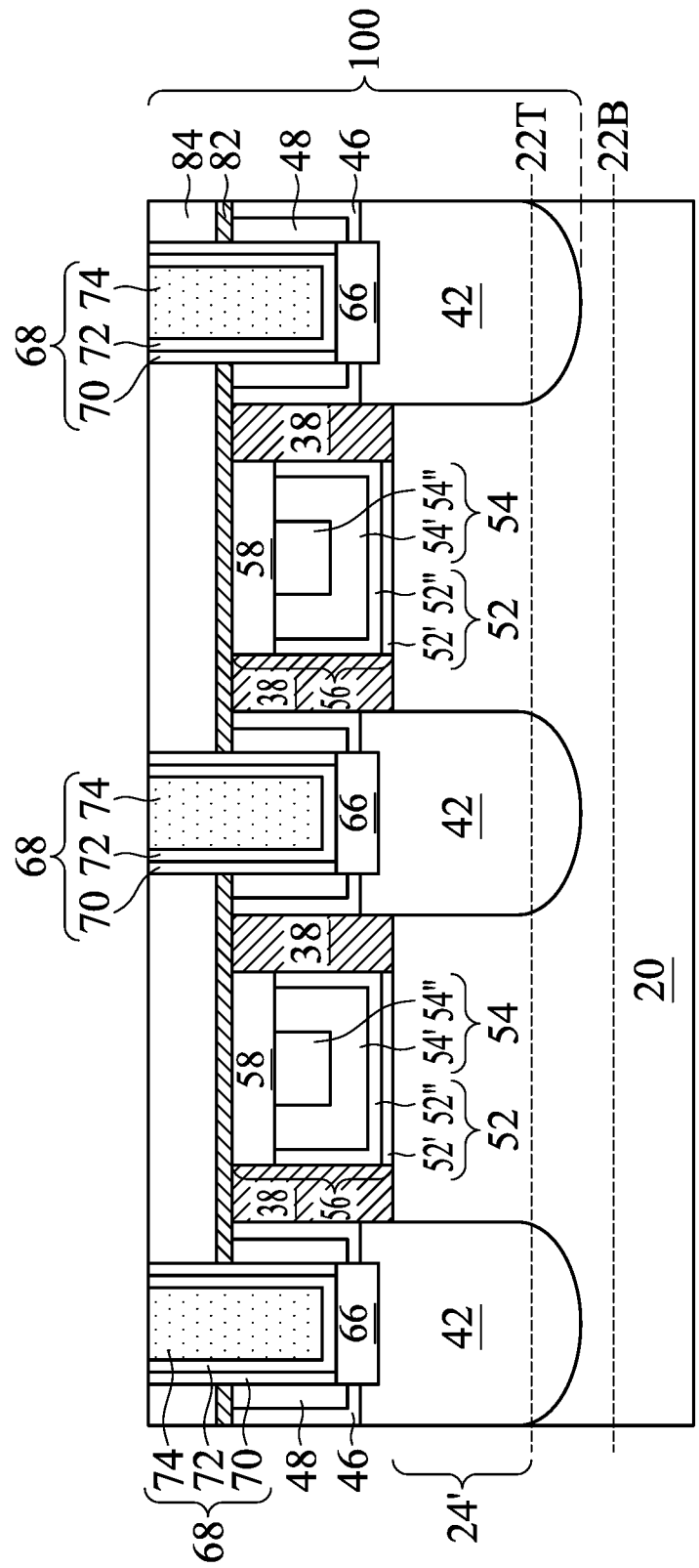

Next, Referring to FIGS. 13A and 13B, etch stop layer 82 and ILD 84 are deposited. Etch stop layer 82 may be formed of silicon nitride, silicon oxy-nitride (SiON), silicon oxy-carbide (SiOC), silicon Carbo-nitride (SiCN), aluminum nitride (AlN), aluminum oxide (AlO$_x$) or the like, or multilayer thereof. ILD 84 may be formed of a material similar to that of ILD 48.

FIGS. 13A and 13B also illustrate a perspective view and a cross-sectional view, respectively, in the formation of source/drain silicide regions 66 and contact plugs 68. The respective process is illustrated as process 220 in the process flow 200 as shown in FIG. 38. FIG. 13B illustrates the reference cross-section 13B-13B in FIG. 13A. The formation process may include etching ILD 84, etch stop layer 82, and ILD 48 to expose the underlying portions of CESL 46, etching the exposed portions of CESL 46 to reveal epitaxy regions 42, depositing metal layer 70 (FIG. 13B), depositing a metal nitride layer (such as a titanium nitride layer) 72, and performing an annealing process to form source/drain silicide regions 66. Next, a metallic material 74, which may comprise cobalt, tungsten, or the like, is filled into the remaining portions of the contact openings. A planarization process such as a CMP process or a mechanical grinding process is then performed to remove excess portions of metal layer 70, metal nitride layer 72, and metallic material 74, leaving contact plugs 68. FinFET 100 is thus formed.

Next, source/drain contact isolation regions 76 are formed, which are also shown in FIG. 13A. The formation process of contact plugs 68 and source/drain contact isolation regions 76 are also shown in the top views and cross-sectional views in FIGS. 14A, 14B, 14C, 15A, 15B, 15C, 16A, 16B, 16C, 17A, 17B, and 17C. The respective process for forming contact isolation regions 76 is illustrated as process 222 in the process flow 200 as shown in FIG. 38. The processes are described briefly herein. Again, the figure number may be followed by letter A, B or C, wherein letter A indicates the corresponding figure shows a top view, and letter B or C indicates that the corresponding view is obtained from the reference cross-section B-B or C-C in the corresponding top view.

Figure 14B:
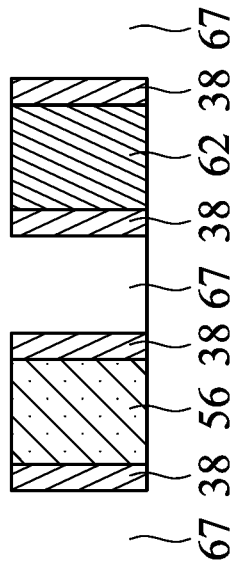
FIGS. 14A, 14B, 14C, 15A, 15B, 15C, 16A, 16B, 16C, 17A, 17B, and 17C illustrate the top views and cross-sectional views in the formation and the cutting of source/drain contact plugs in accordance with some embodiments.
Figure 14C:
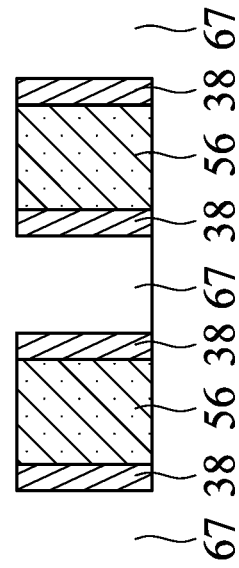
Figure 14A:
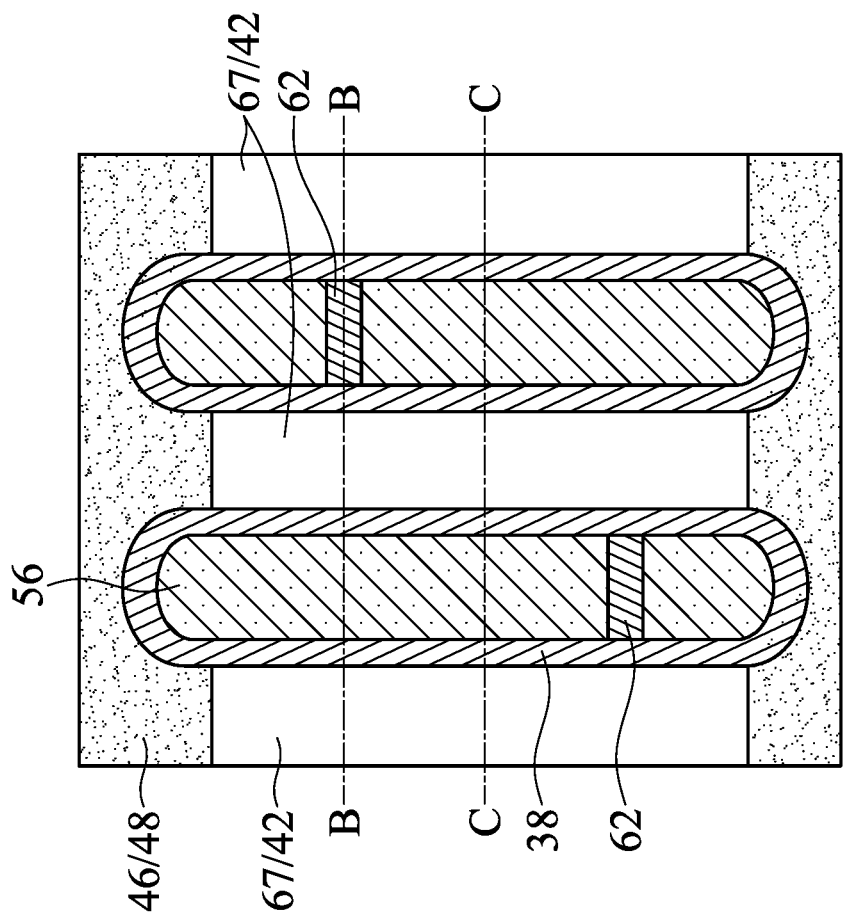
Figure 15B:
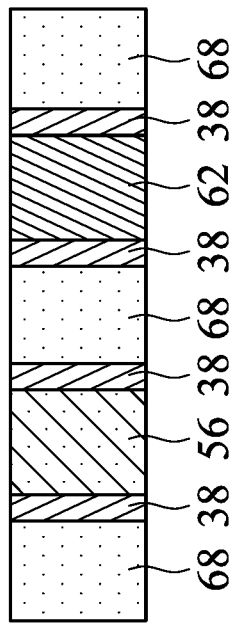
Figure 15C:
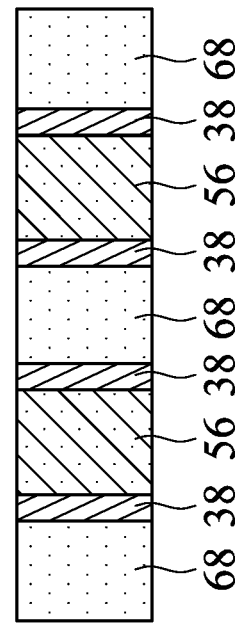
Figure 15A:
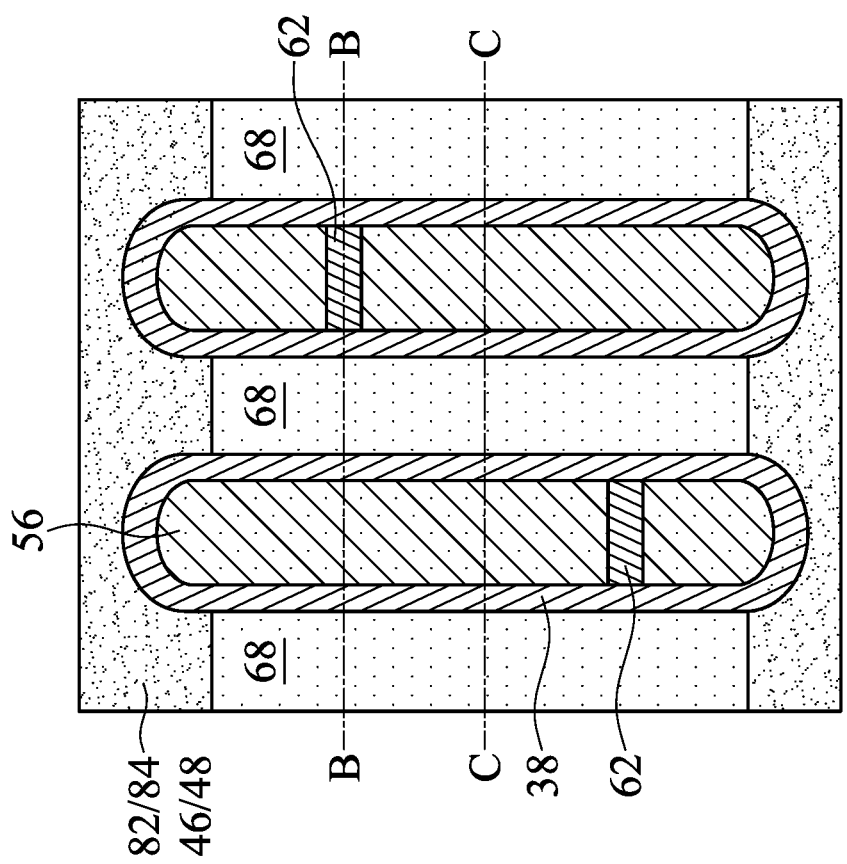
Figure 16B:
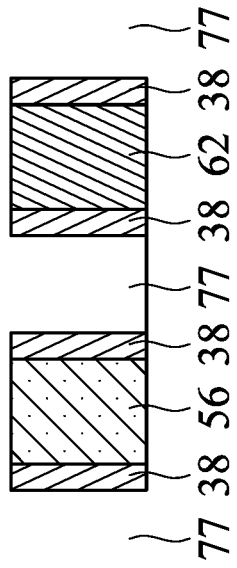
Figure 16C:
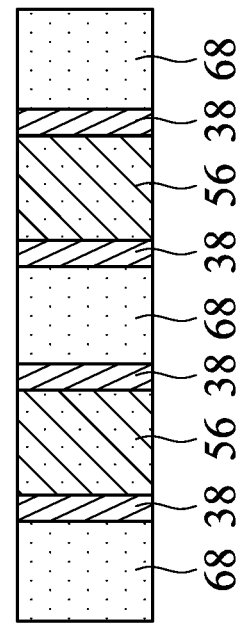
Figure 16A:
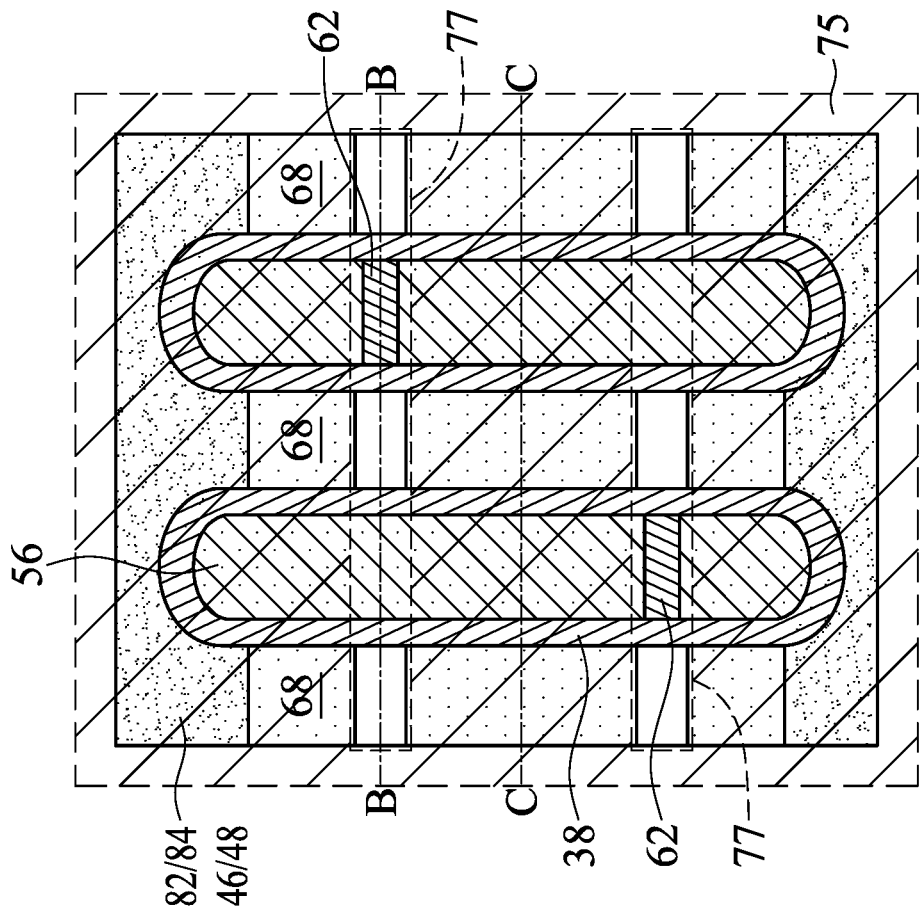

Referring to FIGS. 14A, 14B, and 14C, source/drain contact openings 67 are formed by etching the portions of ILD 48 (FIG. 11A) and CESL 46 over source/drain regions 42. The underlying source/drain regions 42 are exposed. Next, referring to FIGS. 15A, 15B, and 15C, source/drain contact plugs 68 are formed. The details of source/drain contact plugs 68 may be found referring to FIGS. 13A and 13B. FIGS. 16A, 16B, and 16C illustrate the cutting (etching) of source/drain contact plugs 68 for forming openings 77. The cutting is performed by using an etching mask (such as a photo resist) 75, which defines the patterns of openings 77. The opening in etching mask 75 may extend laterally beyond the edges of source/drain contact plugs 68 (rather than being flush with the edge of gate spacers 38) in order to reduce line-end rounding. Openings 77 may extend into (and stop inside) STI region 22, or into semiconductor substrate 20, as may be realized from the illustrated source/drain contact isolation region 76 in FIG. 13A. Etching mask 75 as shown in FIG. 16A is then removed.

Figure 17B:
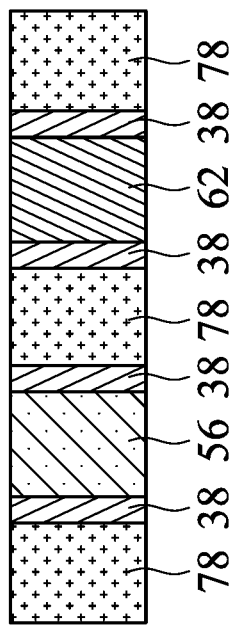
Figure 17C:
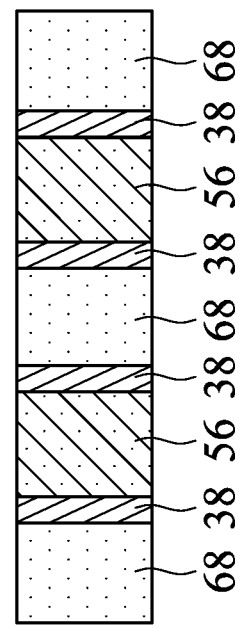
Figure 17A:
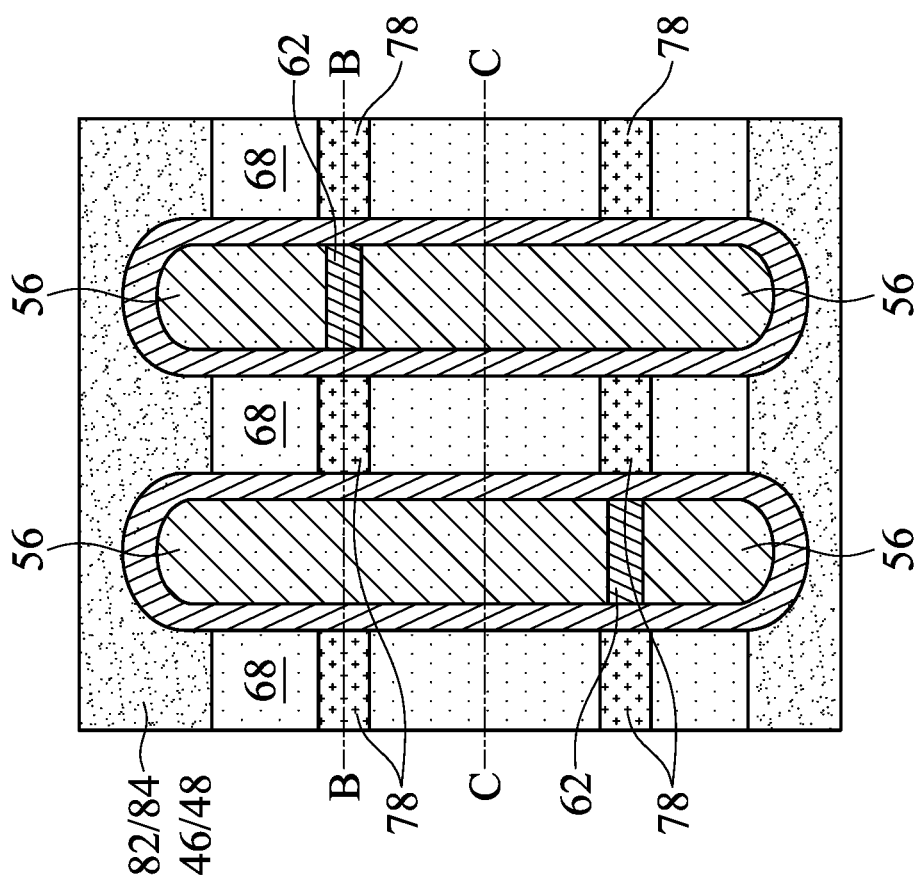

FIGS. 17A, 17B, and 17C illustrate the formation of source/drain contact isolation regions 76, which is also shown in FIG. 13A. The formation process and material of source/drain contact isolation regions 76 may be similar to that of gate contact isolation regions 62, and are not repeated herein.

Figure 18:
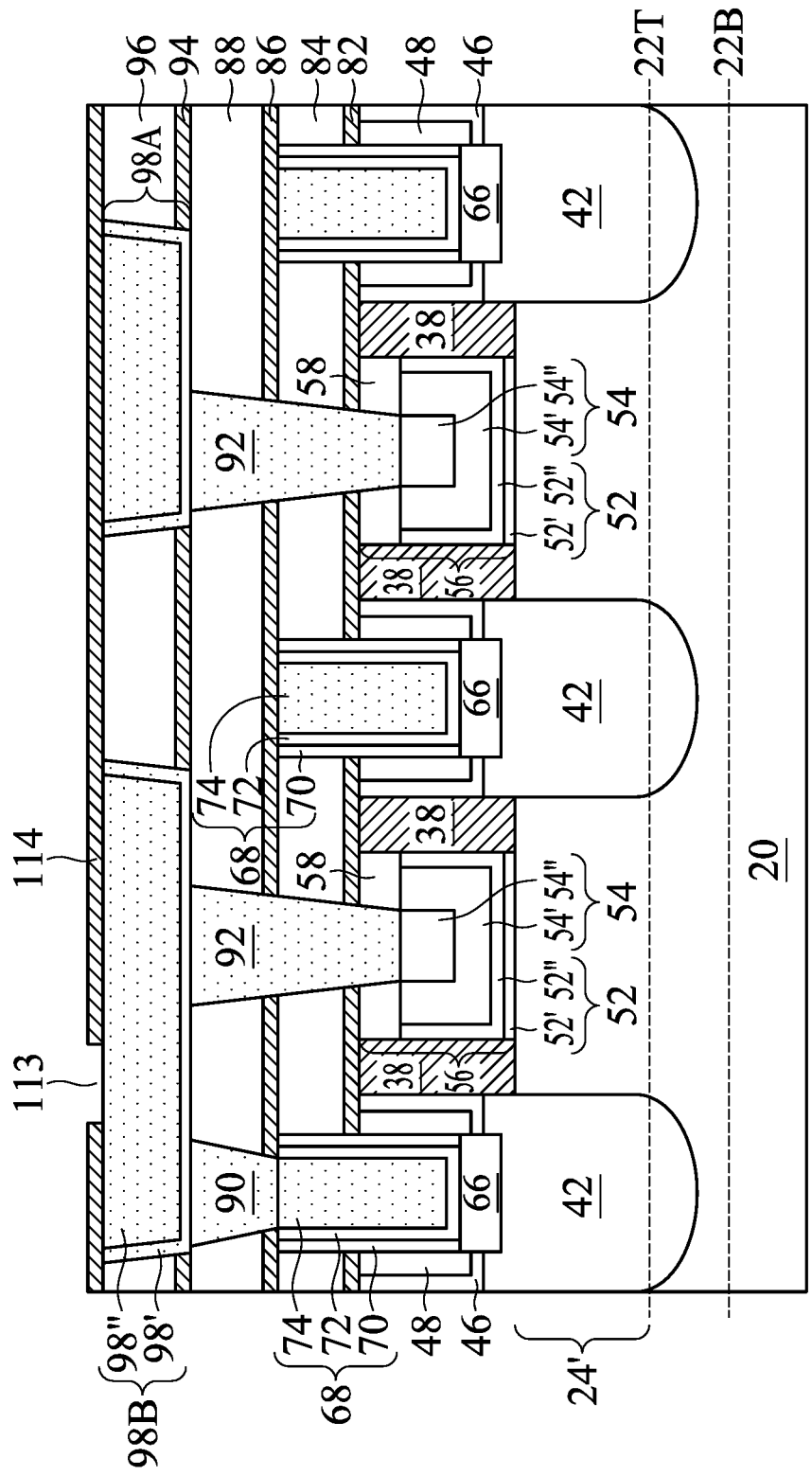

FIG. 18 illustrates the formation of etch stop layer 86 and ILD 88. The formation process and material of etch stop layer 86 and ILD 88 may be similar to that of etch stop layer 82 and ILD 84, respectively. Contact plugs 90 and gate contact plugs 92 are then formed. The formation processes may include etching ILD 88, etch stop layer 86, ILD 84, etch stop layer 82, and hard masks 58 to form openings, depositing a conductive material(s), and then performing a planarization process to remove the excess conductive material. The remaining portions of the conductive material form the contact plugs 90 and 92.

Next, as also shown in FIG. 18, etch stop layer 94 and dielectric layer 96 are deposited. Etch stop layer 94 may be formed of a material selected from the same group of candidate materials for forming etch stop layers 82 and 86. Dielectric layer 96 may be an ILD, which may be formed of a material selected from the same group of candidate materials for forming ILD 48. Alternatively, dielectric layer 96 is an Inter-Metal Dielectric (IMD)). In accordance with some embodiments of the present disclosure, the IMD may be formed of a low-k dielectric material having a dielectric constant (k-value) lower than about 3.0. For example, dielectric layer 96, when being an IMD, may be formed of or comprise a carbon-containing low-k dielectric material, Hydrogen SilsesQuioxane (HSQ), MethylSilsesQuioxane (MSQ), or the like. Dielectric layer 96 may be porous.

Conductive features 98A and 98B (which may be metal lines or contact plugs) are formed in dielectric layer 96. The respective process is illustrated as process 224 in the process flow 200 as shown in FIG. 38. In accordance with some embodiments, the formation process may include a single damascene process, which includes etching dielectric layer 96 and etch stop layer 94 to form trenches, filling conductive materials into the trenches, and performing a CMP process to remove excess conductive materials. Each of conductive features 98A and 98B may include a diffusion barrier 98', and a metallic material 98" over the diffusion barrier 98'. The diffusion barrier 98' may be formed of or comprise titanium nitride, tantalum nitride, titanium, tantalum, or the like. Diffusion barrier 98' may have a basin shape, with the lower portions being narrower than the respective upper portions. The metallic material 98" may include copper or a copper alloy. Due to the single damascene processes, conductive features 98A and 98B may be tapered, with the upper portions being wider than the respective lower portions.

In accordance with alternative embodiments, conductive features 98A and 98B are formed through a deposition-and-patterning process, which includes depositing a blanket metal layer, and performing a first etching process to pattern the blanket metal layer into conductive features 98A and 98B. Etch stop layer 94 and dielectric layer 96 are then formed. Etch stop layer 94 may extend conformally on the top surface and the sidewalls of conductive features 98A and 98B. Dielectric layer 96 may have portions overlapping conductive features 98A and 98B. The top surface of dielectric layer 96 may be planar or non-planar.

FIGS. 19A, 19B, 19C, 20A, 20B, 20C, 21A, 21B, 21C, 22A, 22B, and 22C illustrate the formation of conductive features 98A and 98B as above discussed referring to FIG. 18, and the further cutting of conductive feature 98B. These Figures illustrate the top views and the corresponding cross-sectional views obtained from the reference cross-sections B'-B' and C'-C', respectively, in the respective top views.

Figure 19B:
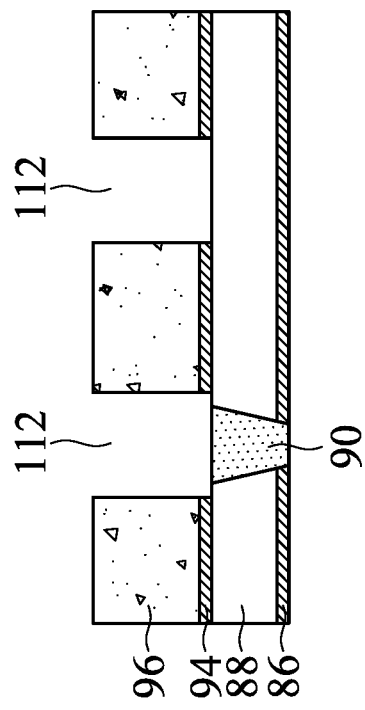
FIGS. 19A, 19B, 19C, 20A, 20B, 20C, 21A, 21B, 21C, 22A, 22B, and 22C illustrate the top views and cross-sectional views in the cutting of a single damascene structure in accordance with some embodiments.
Figure 19C:
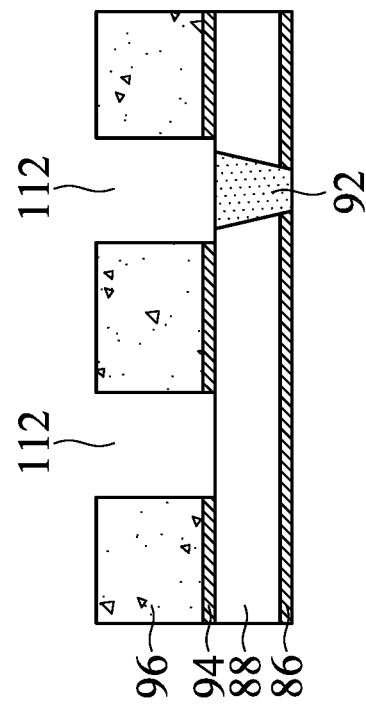
Figure 19A:
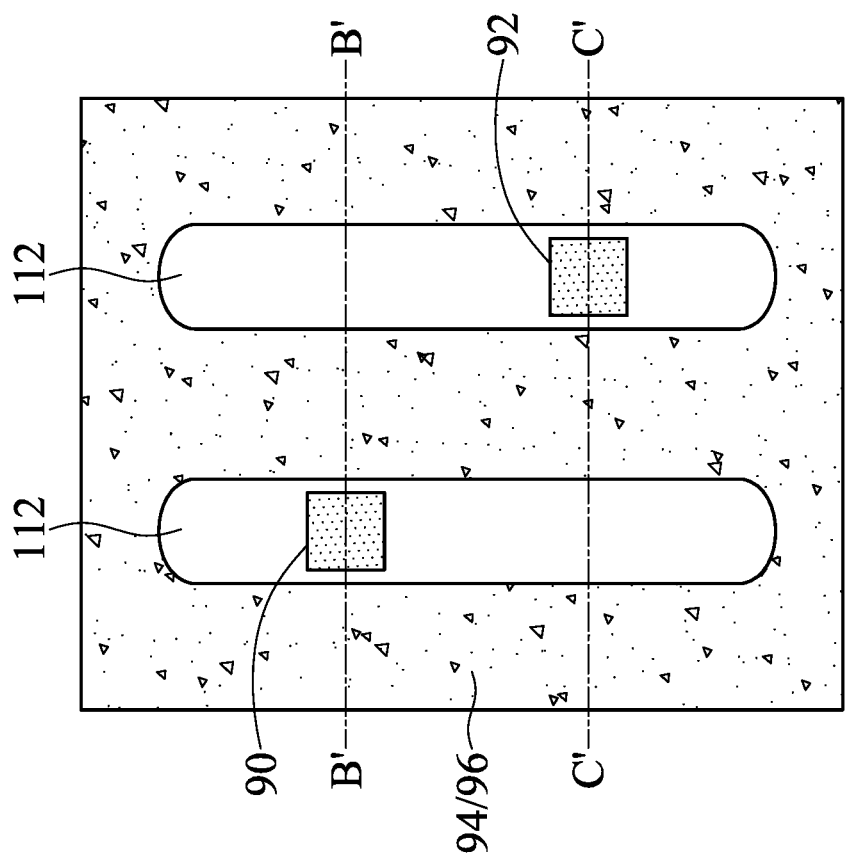
Figure 20B:
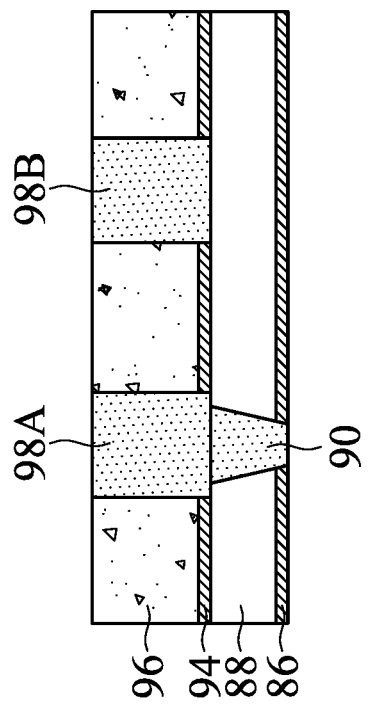
Figure 20C:
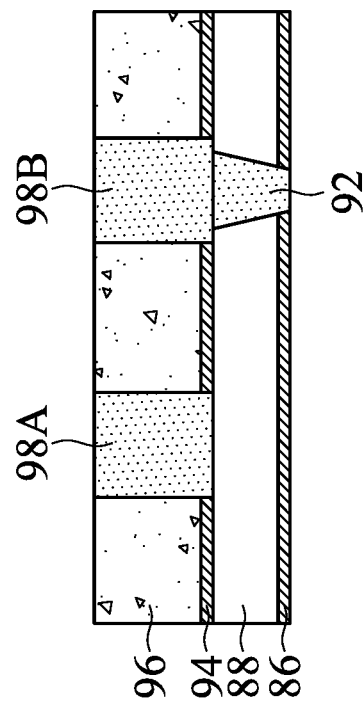
Figure 20A:
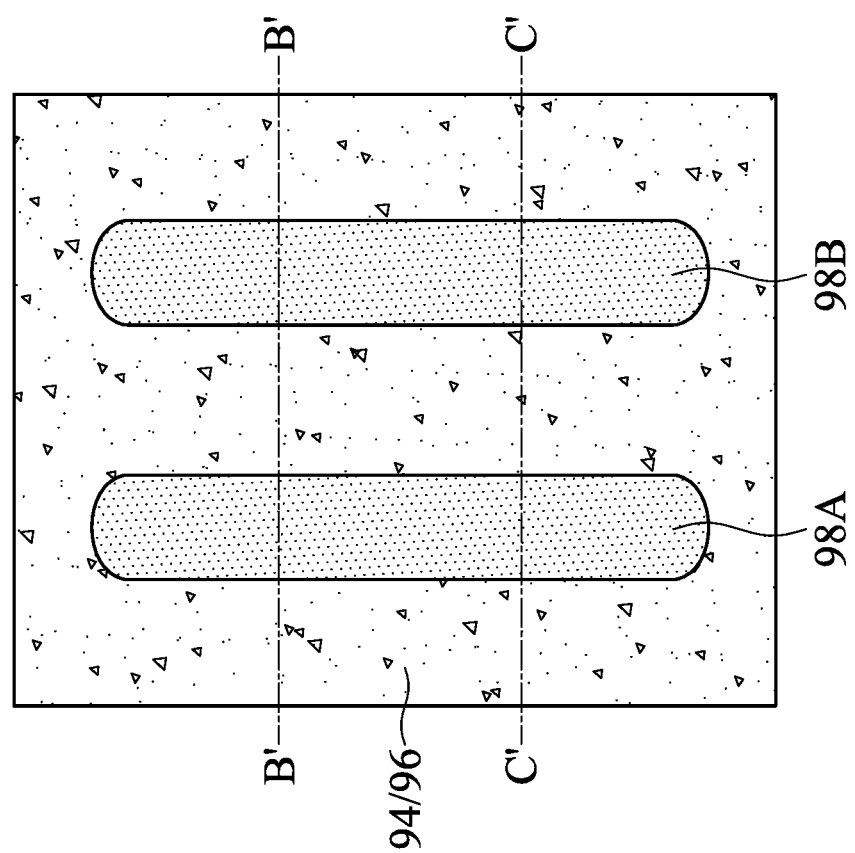
Figure 21B:
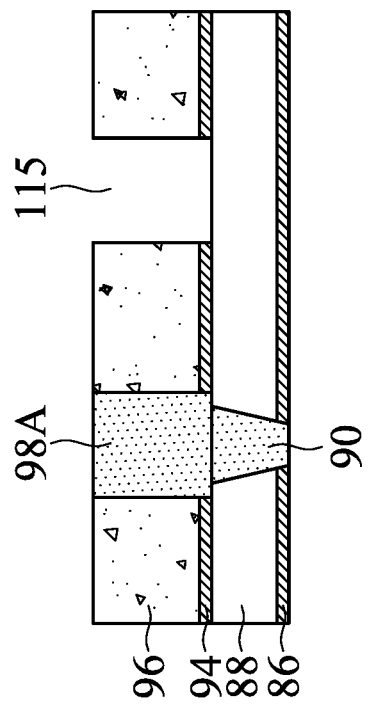
Figure 21C:
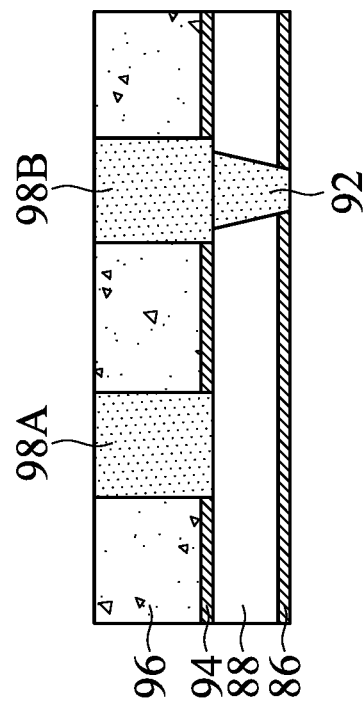
Figure 21A:
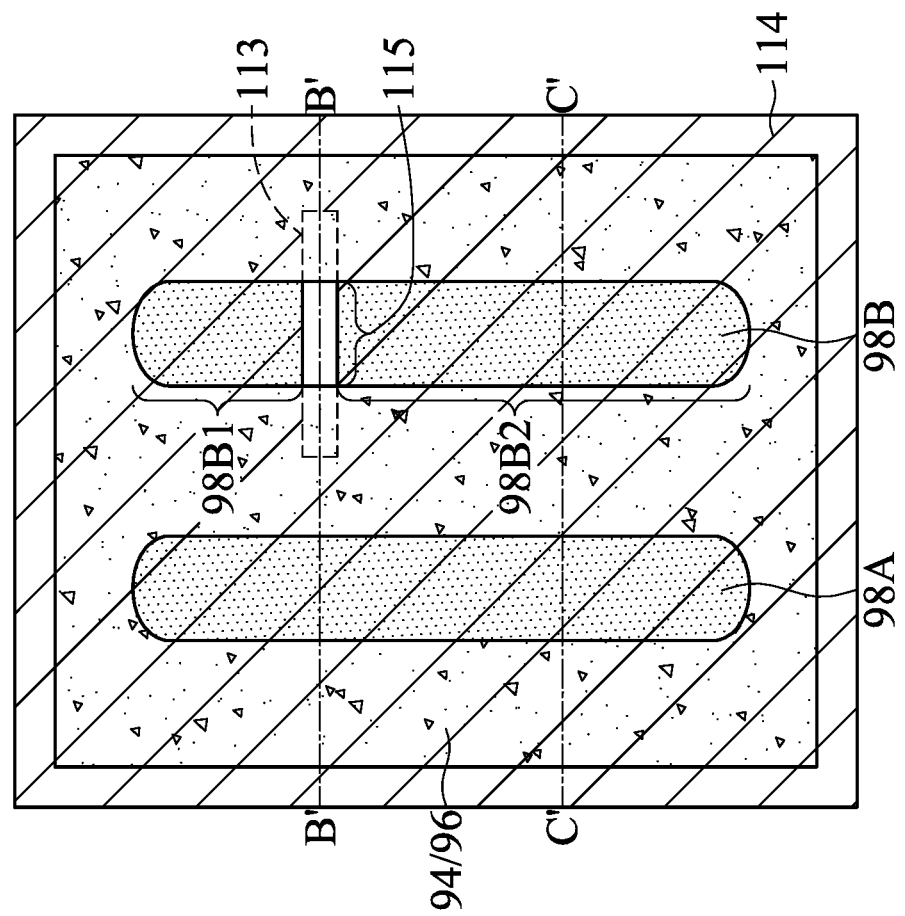

FIGS. 19A, 19B, 19C, 20A, 20B, and 20C illustrate the formation of conductive features 98A and 98B as shown in FIG. 18. Referring to FIGS. 19A, 19B, and 19C, IMD 96 and etch stop layer 94 are etched to form openings 112. The underlying metal features 90 and 92 are exposed. Next, as shown in FIGS. 20A, 20B, and 20C, conductive features 98A and 98B are formed to fill openings 112 through a single damascene process. Referring to FIGS. 21A, 21B, and 21C, etching mask 114 is formed, and has opening 113 therein. Etching mask 114 and opening 113 are also shown in FIG. 18. Etching mask 114 is used to etch conductive feature 98B, so that opening 115 is formed in conductive feature 98B, and extends down to penetrate through conductive features 98B. In accordance with some embodiments, as shown in FIG. 21A, the portions of IMD 96 exposed to opening 115 is not etched, and opening 115 is limited in conductive feature 98B. In accordance with alternative embodiments, conductive feature 98B, IMD 96, and etch stop layer 94 are etched. The portions of the etch stop layer 94 exposed to the removed portions of IMD 96 may or may not be etched-through. Opening 115 has the same top-view shape and size as opening 113 in etching mask 114. Conductive feature 98B is separated into portions 98B1 and 98B2 by opening 115. Etching mask 114 is then removed.

Figure 22B:
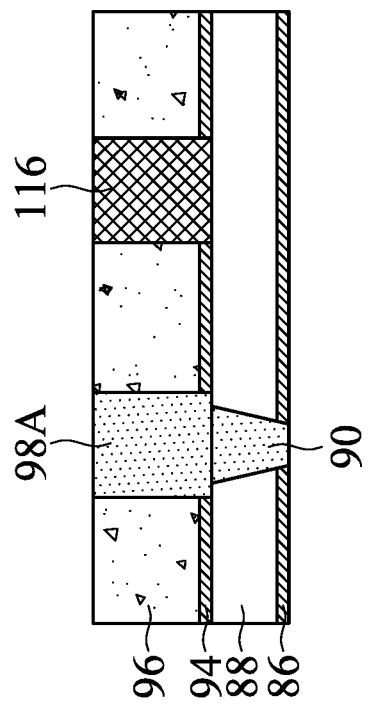
Figure 22C:
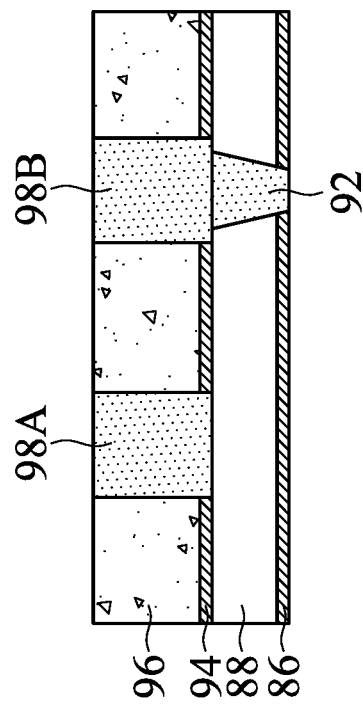
Figure 22A:
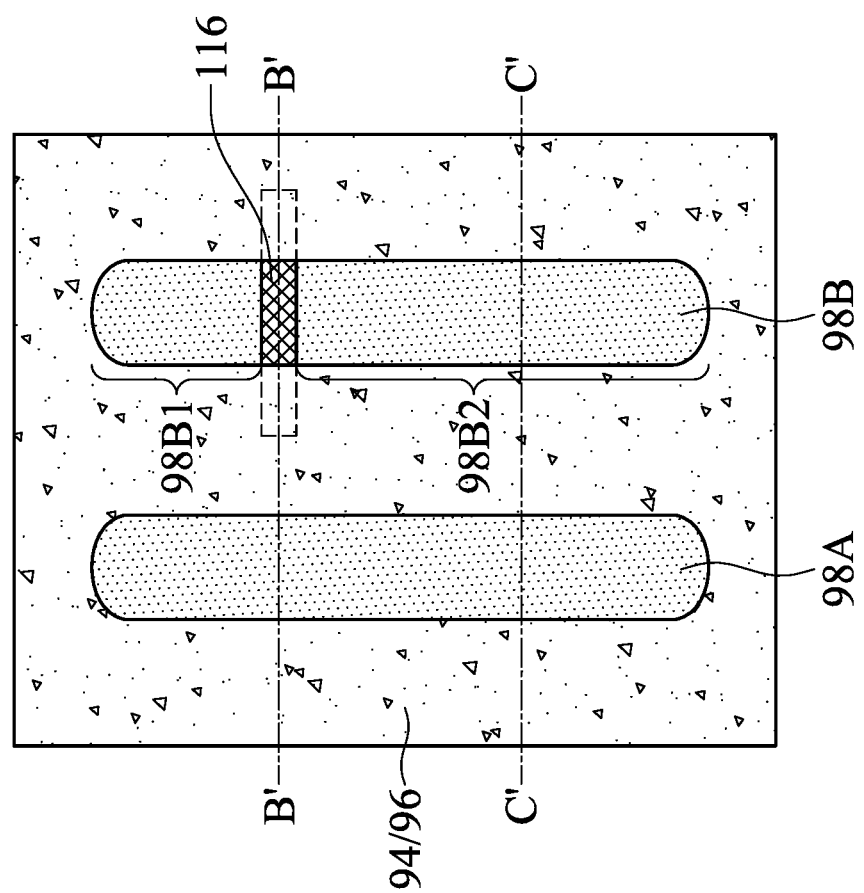

After the removal of etching mask 114, a dielectric material is filled into opening 113, followed by a planarization process to form isolation region 116, which is shown in FIGS. 22A, 22B, and 22C. The respective process is illustrated as process 226 in the process flow 200 as shown in FIG. 38. Isolation region 116 may be formed of SiN, SiC, SiO$_2$, SiCN, SiOC, or the like. It is appreciated that although FIG. 21A 22A illustrates that conductive feature 98B is cut into two portions, it may be cut into more portions, as shown in FIG. 35 (represented by features 150A, 150B, and 150C). In accordance with some embodiments, isolation region 116 has edges aligned to the edges of conductive portions 98B1 and 98B2. In accordance with alternative embodiments, isolation region 116 extends beyond the edges of conductive portions 98B1 and 98B2 and into IMD 96, and may or may not extend into etch stop layer 94.

Figure 23:
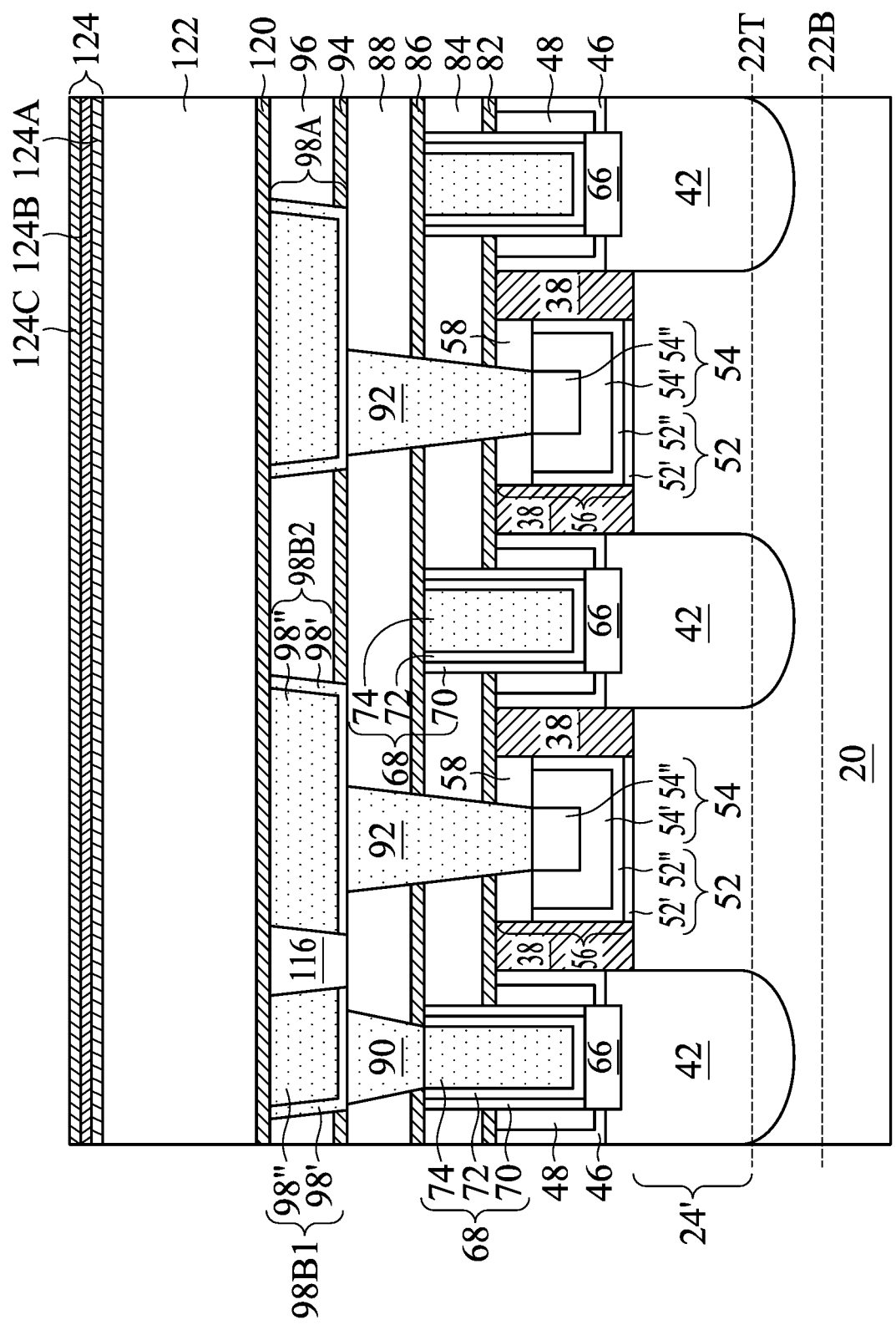

FIG. 23 illustrates a cross-sectional view of isolation region 116. Isolation region 116 penetrates through dielectric layer 96 and etch stop layer 94, and is in contact with ILD 88. Both of diffusion barrier 98' and the metallic material 98" are cut apart, so that in each of conductive features 98B1 and 98B2, diffusion barrier 98' extends on one of the sidewalls of metallic material 98", and does not extend on the other sidewall of metallic material 98". Furthermore, the opposing sidewalls of conductive features 98B1 and 98B2 may tilt to the same direction, which is different from the un-cut metal features such as 98A, in which opposing sidewalls tilt to opposite directions. It is appreciated that if viewed in a cross-section perpendicular to the illustrated cross-section as shown in FIG. 23, the shape of conductive features 98B1 and 98B2 will be essentially the same as that of conductive feature 98A. For example, in the other cross-sectional view, conductive features 98B1 and 98B2 have opposing sidewalls tilting to opposite directions, and also have diffusion barrier 98' extending on the opposing sidewalls of metallic material 98". These shapes are the result of the original basin shape of diffusion barrier 98' before the cutting, and the cutting process.

Although not shown in detail, source/drain contact plugs 68 include nitride layer 72 and filling metal 74, which is similar to the situation that conductive features 98A include diffusion barrier 98' and filling metal 98". Also, source/drain contact plugs 68 is cut, similar to the cutting of conductive feature 98B. Accordingly, the side views of the cut portions of source/drain contact plugs 68 may be the same as the side views of conductive features 98B1 and 98B2. Also, before the cutting of source/drain contact plugs 68, nitride layer 72 forms a basin having a similar shape as that of diffusion barrier 98'. Accordingly, the views of nitride layer 72 after cutting will be the same as that of diffusion barrier 98'.

In accordance with some embodiments in which conductive features 98A and 98B are formed through deposition-and-patterning (rather than a damascene process), the formation of conductive features 98B1 and 98B2 went through two etching (patterning) processes, with the first etching process being performed on the blanket metal layer to form conductive features 98A and 98B, and the second etching process being performed on the conductive feature 98B to form conductive features 98B1 and 98B2.

FIG. 23 also illustrates the formation of etch stop layer 120, dielectric layer 122 (which may be an IMD), and hard mask 124. The respective process is illustrated as process 228 in the process flow 200 as shown in FIG. 38. In accordance with some embodiments, etch stop layer 120 is formed using a similar material and a similar method as that of etch stop layer 86. IMD 122 may be formed of or comprises a low-k dielectric material similar to that of IMD 96. Hard mask 124 may have a single-layer structure or a multi-layer structure. In accordance with some embodiments, hard mask 124 has an ONO structure including silicon oxide layer 124A, silicon nitride layer 124B over silicon oxide layer 124A, and another silicon oxide layer 124C over silicon nitride layer 124B.

FIGS. 24 through 33 illustrate the perspective views of the processes for patterning hard mask 124, using the patterned hard mask 124 to etch dielectric layer 122 and etch stop layer 120, and forming conductive features in dielectric layer 122 and etch stop layer 120.

Figure 25B:
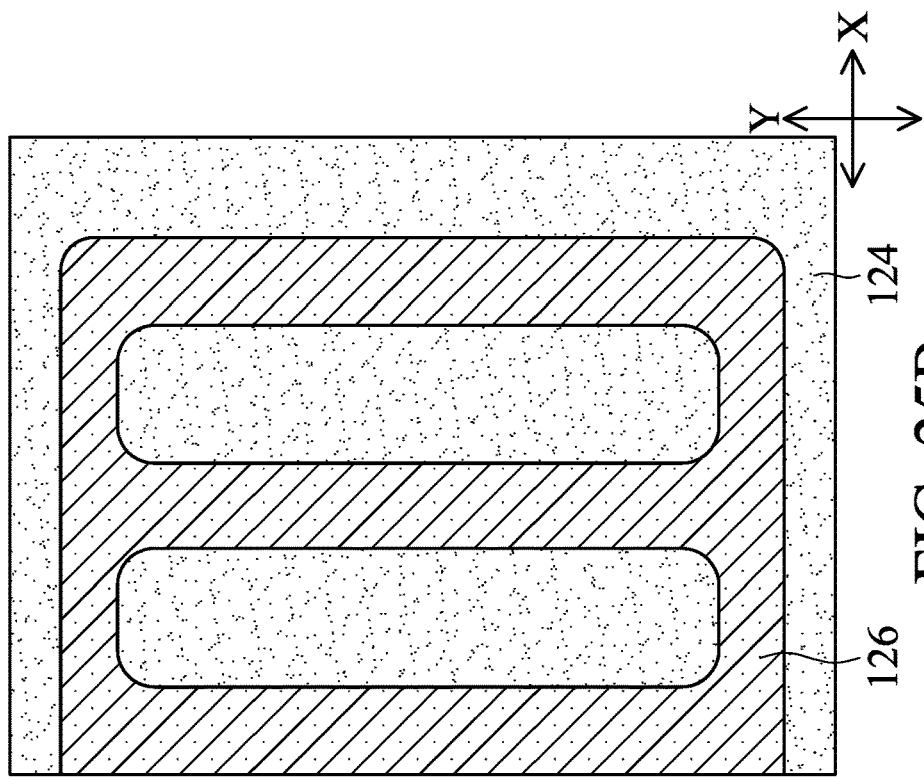
Figure 24:
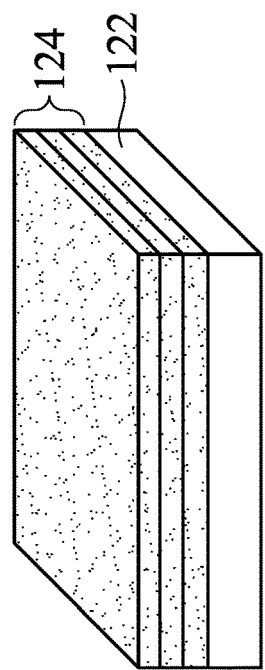
Figure 25A:
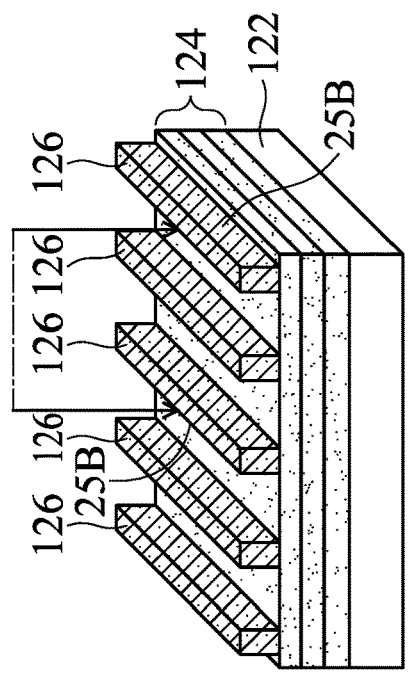

FIG. 24 illustrates a perspective view of dielectric layer 122 and hard mask 124, which has been shown in FIG. 23. Next, as shown in FIG. 25A, mandrels 126 are formed over hard mask 124. The respective process is illustrated as process 230 in the process flow 200 as shown in FIG. 38. In accordance with some embodiments of the present disclosure, mandrels 34 are formed of amorphous silicon, amorphous carbon, or another material that has a high etching selectivity relative to the underlying hard mask 124. Mandrels 126 are formed by depositing a blanket layer, and then etching (patterning) the blanket layer to form mandrels 126. The patterning of mandrels 126 is achieved by forming a patterned photo resist or a tri-layer. In accordance with some embodiments, as shown in FIG. 25B, which shows a top view, mandrels 126 include elongated strips extending in the Y-direction, and elongated strips extending in the X-direction, which define openings therein. In accordance with alternative embodiments, there are no elongated strips extending in the X-direction, and all mandrel strips extend in the Y-direction. In accordance with these embodiments, the subsequently formed mask strips may be used to define the boundaries of the openings in the Y-direction.

Figure 26B:
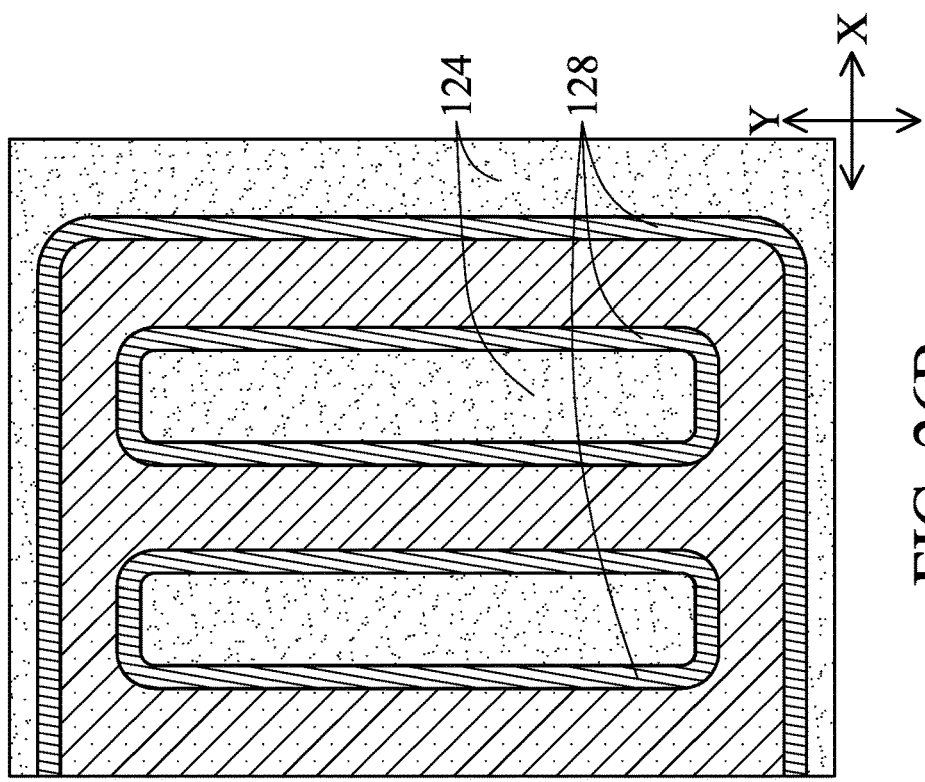
Figure 26A:
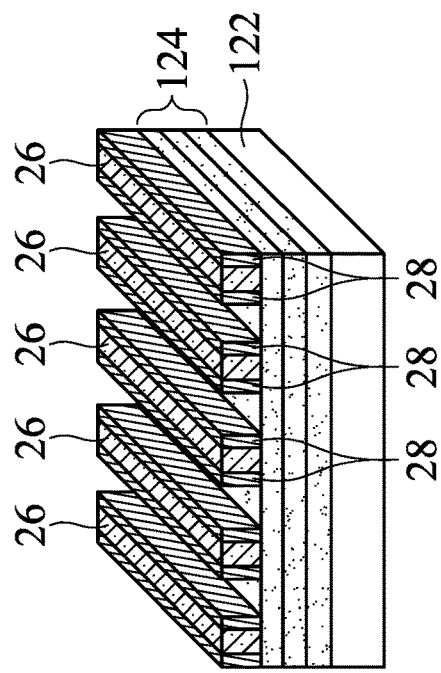

Referring to FIGS. 26A and 26B, which illustrate a perspective view and a top view, respectively, spacers 128 are formed on the sidewalls of mandrels 126. The respective process is illustrated as process 232 in the process flow 200 as shown in FIG. 38. In accordance with some embodiments, the formation of spacers 128 includes depositing a conformal spacer layer, and performing an anisotropic etching process to remove the horizontal portions of the spacer layer, while the vertical portions of the spacer layer remain, and are referred to as spacers 128. In accordance with some embodiments of the present disclosure, spacers 128 comprise silicon nitride, silicon oxide, silicon carbide, silicon carbo-nitride, or the like. As shown in FIG. 26B, spacers 128 may include rings when mandrels 126 include elongated strips in the X-directions. The formation of spacers 128 may reduce the size of the regions encircled by the rings, and hence reduce the widths of the metal features to be formed in subsequent processes. Throughout the description, each of mandrels 126 and the spacers 128 contacting its opposing sidewalls are collectively referred to as a mask group 126/128.

Figure 27:
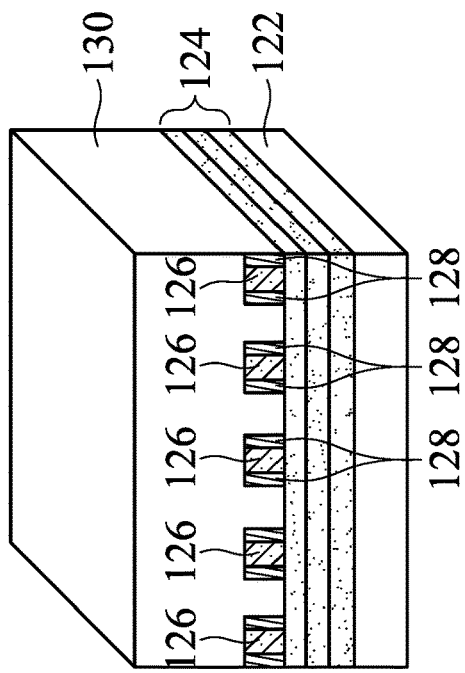

FIG. 27 illustrates the formation of template layer 130, which is formed of a material different from the materials of mandrels 126, spacers 128, and hard mask 124. The material may include silicon nitride, silicon oxide, silicon carbide, silicon carbo-nitride, and the like, and/or combinations thereof. Template layer 130 is deposited to a level higher than the top surfaces of mandrels 126 and spacers 128, followed by a planarization process to level its top surface.

Figure 28:
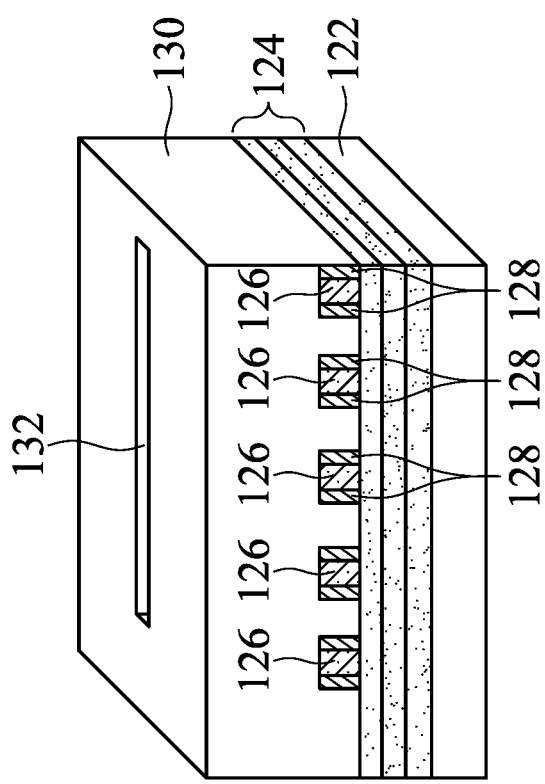

Next, referring to FIG. 28, template layer 130 is etched to form opening 132. The etching process is performed until the underlying mandrels 126, spacers 128, and hard mask 124 are exposed. The exposed mandrels 126, spacers 128, and hard mask 124 are not etched. Although one opening 132 is illustrate, there may be a plurality of openings formed overlapping mandrels 126 and spacers 128, with the plurality of openings being parallel to each other and crossing over the same groups of mask groups 126/128.

Figure 29:
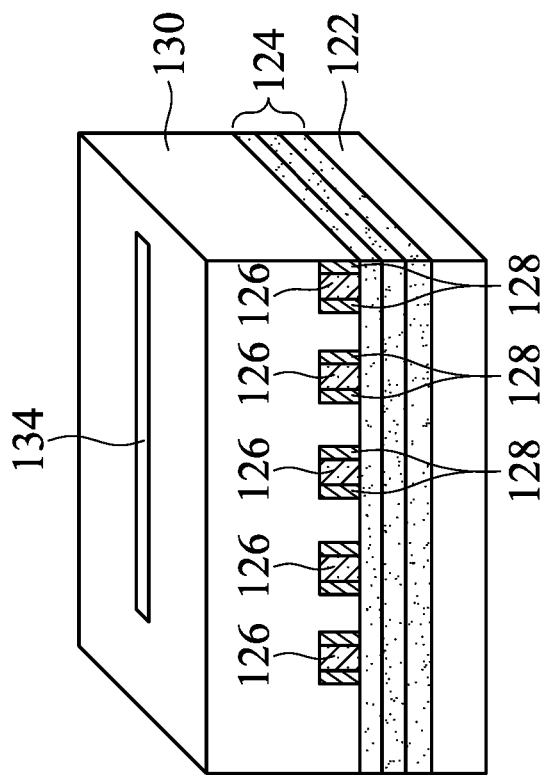

FIG. 29 illustrates the formation of mask strip 134 in opening 132, which may include filling opening 132, and then performing a planarization process. The respective process is illustrated as process 234 in the process flow 200 as shown in FIG. 38. The mask strip 134 may be formed of a material different from the materials of template layer 130, mandrels 126, spacers 128, and hard mask 124, and may be selected from silicon nitride, silicon oxide, silicon carbide, silicon carbo-nitride, titanium nitride, boron nitride, aluminum oxide, aluminum nitride, or the like, or combinations thereof.

In subsequent processes, the structure shown in FIGS. 30A and 30B is formed. The formation process may include continuing planarizing (polishing) template layer 130 and mask strip 134. In accordance with some embodiments, the planarization process is stopped by mandrels 126 and/or spacers 128, which act as a polishing stop layer. In accordance with alternative embodiments, the planarization process is stopped before mandrels 126 and spacers 128 are exposed. Template layer 130 is then removed in an etching process, while mask strip 134, mandrels 126, and spacers 128 are not etched. Subsequently, mask strips 134 may be etched back to reduce its top surface to a level lower than the top surfaces of mandrels 126 and spacers 128. Reducing the height of mask strips 134 may reduce the shading effect in the subsequent etching of mask layer 124, so that the corners of the openings formed in mask layer 124 are sharper. In accordance with alternative embodiments, mask strips 134 are not etched back, and the top surfaces of mask strips 134 are higher than or coplanar with the top surfaces of mandrels 126 and spacers 128 within process variation.

As shown in FIGS. 30A and 30B, each of mask strips 134 is separated into a plurality of mask strips 134, each between two neighboring mask groups 126/128. Mask strips 134 and their joining mask group 126/128 form sharper corners 136A (FIG. 30B) than the corners 136B formed by spacers 128. It is appreciated that although there is one mask strip (which is separated into a plurality of portions) illustrated, there may be a plurality of parallel mask strips formed, which are illustrated using dashed lines. The distances between the parallel mask strips 134 determine the lengths of the subsequently formed metal lines.

In subsequent processes, mandrels 126, spacers 128, and mask strips 134 are collectively used as an etching mask to etch the underlying hard mask 124, for example, hard mask layer 124C in hard mask 124. The resulting structure is shown in FIG. 31. Openings 138 are thus formed. The respective process is illustrated as process 236 in the process flow 200 as shown in FIG. 38. In subsequent processes, hard mask layers 124B and 124A are etched by using the patterned hard mask layer 124C as the etching mask, followed by etching dielectric layer 122. Openings 138 thus extend into dielectric layer 122. The respective process is illustrated as process 238 in the process flow 200 as shown in FIG. 38. The sharper corners 136A (FIG. 30B) and more rounded corners 136B are also transferred into dielectric layer 122. Hard mask 124 is then removed, and FIG. 32 illustrates the resulting dielectric layer 122, in which openings 138 are formed. It is appreciated that openings 138 may represent the trenches for forming metal lines, while the via openings for forming vias underlying the metal lines are also formed, and are not shown.

FIG. 33 illustrates the formation of metal lines 142, which are formed by depositing diffusion barrier 146' (refer to FIG. 34) as a conformal layer, filling the openings with a metallic material 146", and then performing a planarization process to remove excess portions of barrier 146' and metallic material 146". The respective process is illustrated as process 240 in the process flow 200 as shown in FIG. 38. The diffusion barrier layer 146' may be formed of or comprises Ti, TiN, Ta, TaN, or the like. The metallic material 146" may be formed of or comprise copper or a copper alloy. The resulting metal lines 142 and via 144 are shown in FIG. 34.

Figure 34:
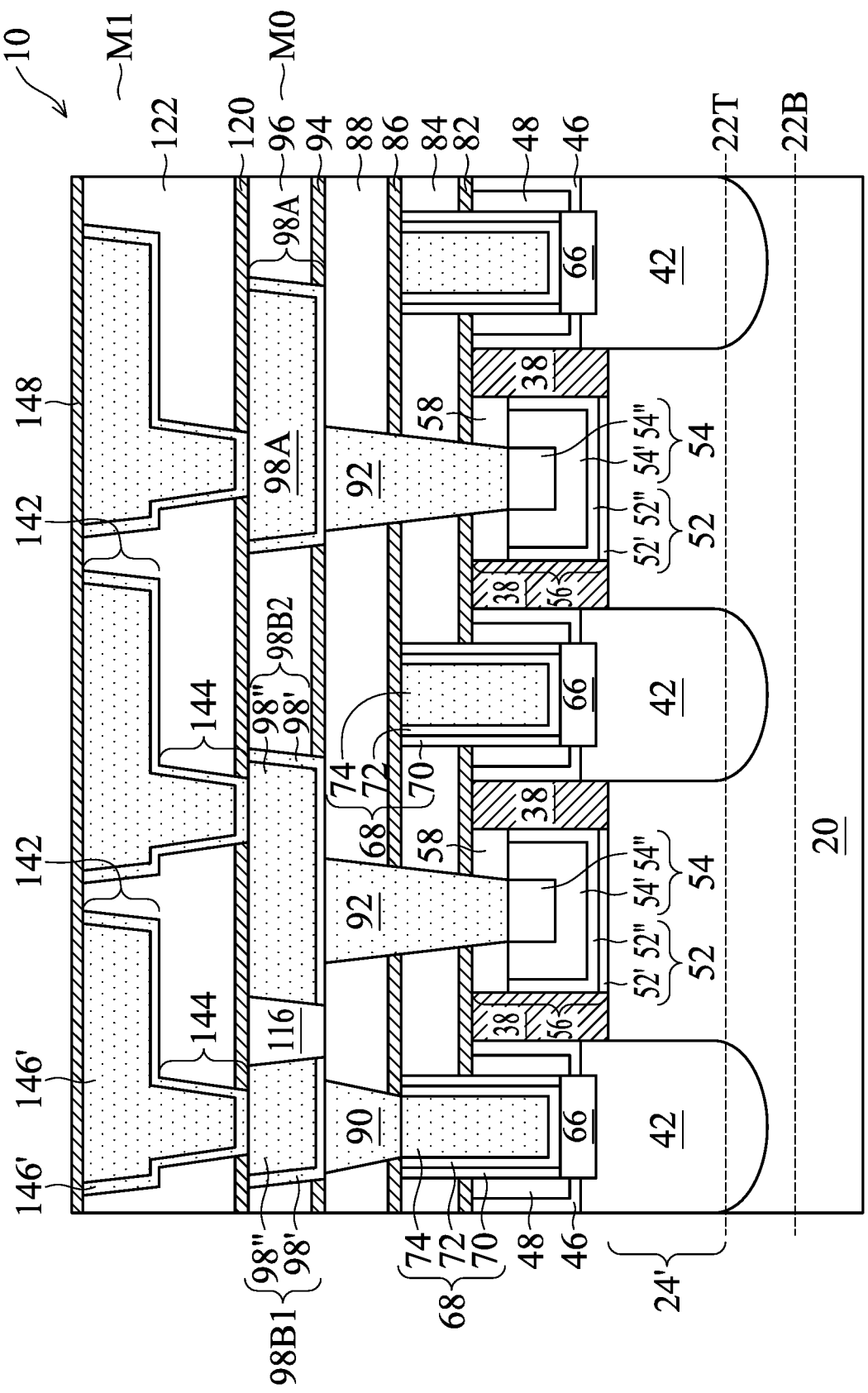

FIG. 34 also illustrates the deposition of etch stop layer 148. Subsequently, more IMDs (for example, low-k dielectric layers), vias, and metal lines may be formed over metal lines 142. The formation process may adopt the process as shown in the preceding embodiments, or may adopt photo resists (rather than mandrels, spacers, template layers, and mask strips).

FIG. 35 illustrates a top view of a conductive feature group 150, which may represent any of conductive features 56 and 68 (FIG. 17A), conductive features 98B (including 98B1 and 98B2, FIG. 22A), and conductive features 142 (FIG. 34). Each of conductive feature group 150 includes a plurality of portions, which may include two, three, or more portions that are separated from each other. The plurality of portions have lengthwise directions aligned to the same straight line 154. For example, the illustrated example conductive feature 150 includes end portions 150A and 150C, and middle portion(s) 150B between the end portions 150A and 150C. Conductive feature group 150 may be originally formed as a long strip, and is then cut apart, or may be formed using mandrels, spacers, and mask strips. Due to the formation process as discussed, the end corners of the conductive features 150A and 150C may be more rounded, for example, with radius R1. The inner corners of conductive features 150A, 150B, and 150C, which face other portions of the conductive feature group 150, are curved and have radius R2. In accordance with some embodiments, ratio R2/R1 is smaller than about 0.5, and may be in the range between about 0.05 and about 0.5. In addition, conductive feature portions 150A, 150B, and 150C may have width W1, and ratio R1/W1 is greater than about 0.5, and may be in the range between about 0.5 and about 2.0. Ratio R2/W2, on the other hand, may be smaller than about 0.2, and may be in the range between about 0.05 and about 0.2. Furthermore, radius R2 may be smaller than about 3 nm, and may be in the range between about 0.5 nm and about 3 nm.

In FIG. 35, conductive feature group 150 is separated from other conductive features 152 (which are formed through the same processes as conductive feature group 150) by spacing S2. The inner-group spacings between neighboring conductive features in the conductive feature group 150 is S1, which is smaller than inter-group spacing S2. In accordance with some embodiments, inner-group spacing S1 may be in the range between about 8 nm and about 20 nm. Spacing ratio S2/S1 may be greater than about 2, and may be greater than about 3.0. The inter-group spacing S3 between conductive features group 150 and other conductive features (also denoted as 150) that are parallel to conductive features group 150 may be smaller than about 20 nm, in the range between about 10 nm and about 20 nm, or smaller than about 20 nm.

Figure 37:
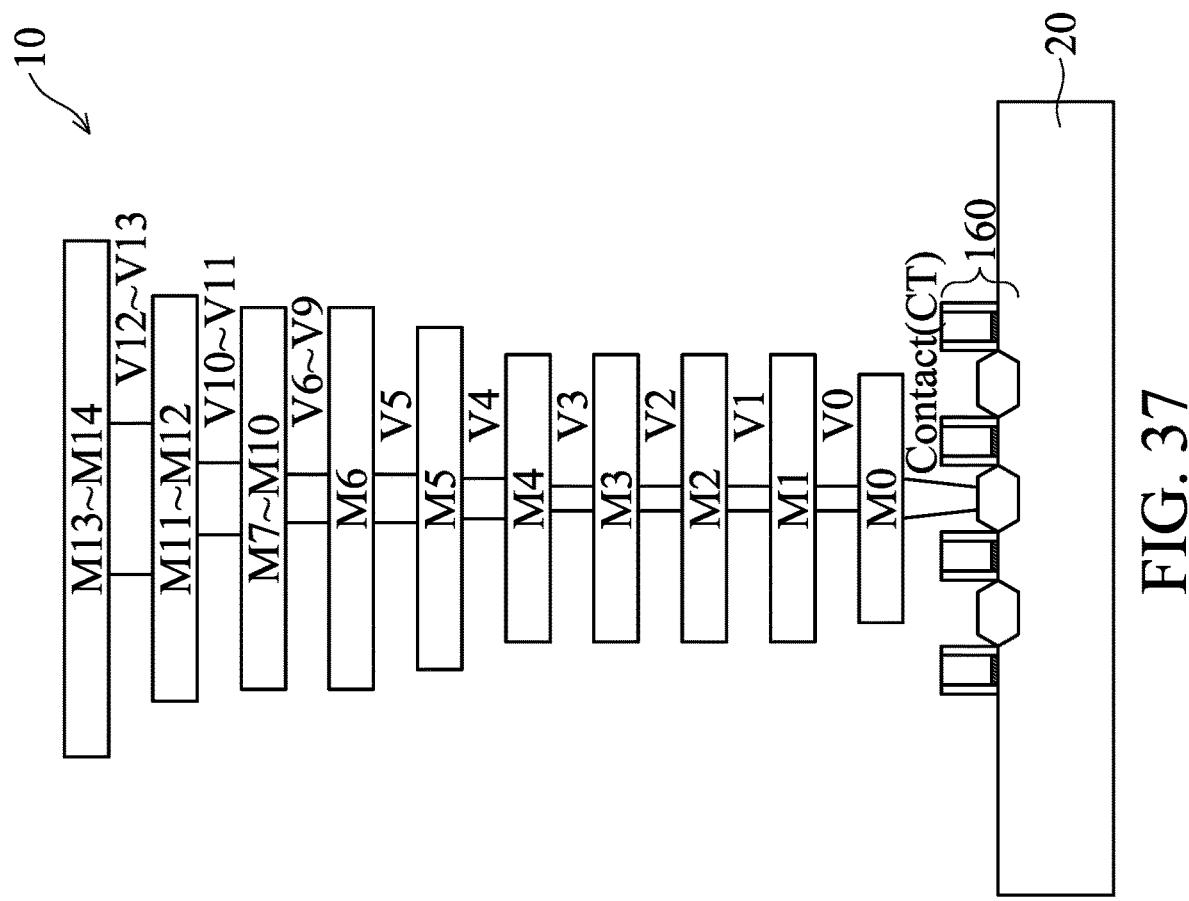
FIG. 37 illustrates the layers of conductive features in a wafer in accordance with some embodiments.

FIG. 36 illustrates the conductive features 150' formed in accordance with alternative embodiments of the present disclosure. These embodiments may be formed using conventional processes, for example, without the cutting processes for conductive features 56, 68, and 98B being performed. Accordingly, the opposing ends of conductive features 150' all have radius R1 as above-discussed. Alternatively, these embodiments may be for forming upper metal layers, as discussed referring to the upper metal layers as shown in FIG. 37. It is appreciated that the embodiments in FIGS. 35 and 36 may co-exist on the same layer in the same die and wafer.

It is appreciated that when the mandrels 126 (FIG. 26B) do not include portions having lengthwise direction parallel to the X-direction, the corners of the end portions 150A and 150B may also be defined by mask strips 134, and also have radius R2. The corresponding corners are also shown with dashed lines 155 in FIG. 25. In these embodiments, the boundaries of the end portions are defined by mask strips 134, rather than the portions of mandrels 126 with lengthwise directions in the X-direction.

FIG. 37 illustrates the scheme of layers of conductive features in wafer 10. Circuit devices such as transistor 160 are formed at the top surface of semiconductor substrate 20. There is a contact (CT) layer, in which contact plugs 56/68 (FIG. 17A) are formed. Metal layer M0, which may include metal lines therein, are formed over the contact layer. Metal layer M0 may correspond to conductive features 98A, 98B1 and 98B2 (FIG. 34). There are also a plurality of metal layers such as M1 up to Mn and via layers such as V1 through V(n−1) formed, wherein integer n may be greater than 5, and may be in the range between about 5 and 15. In accordance with some embodiments, lower layers such as metal layers M0, M1, M2, etc. may have conductive features formed in accordance with the embodiments of the present disclosure. Accordingly, the respective conductive features may have the structure as shown in FIG. 35. The upper layers such as metal layers Mn, M(n−1), M(n−2) etc., may have conductive features formed using conventional damascene processes, and have the structure as shown in FIG. 36. In accordance with some embodiments, there may be a threshold metal layer (such as M3, M4, or M5, etc.), and the conductive features in the threshold metal layer and all of the metal layers under the threshold metal layer include features formed using the processes in accordance with embodiments of the present disclosure, and have the structure as shown in FIG. 35. All of the metal layer over the threshold metal layer, however, may have the structure as in FIG. 36, and may be free from the structure shown in FIG. 36 in accordance with some embodiments.

The embodiments of the present disclosure have some advantageous features. By adopting the processes of the present disclosure to form conductive features, at least some corners of the conductive features are sharper. The effective area of these conductive features is increased due to the increased corner area. The contact resistance between these conductive features and other conductive features landing on these conductive features may be reduced by differences greater than about 15 percent. This also results in reduced Joule heating and reduced electro-migration.

In accordance with some embodiments of the present disclosure, a method comprises depositing a dielectric layer; depositing a plurality of mandrel strips over the dielectric layer; forming a plurality of spacers on sidewalls of the plurality of mandrel strips to form a plurality of mask groups, wherein each of the plurality of mandrel strips and two of the plurality of spacers form a mask group in the plurality of mask groups; forming a mask strip connecting two neighboring mask groups in the plurality of mask groups; using the plurality of mask groups and the mask strip collectively as an etching mask to etch the dielectric layer, and to form trenches in the dielectric layer; and filling a conductive material into the trenches to form a plurality of conductive features. In an embodiment, the forming the plurality of spacers comprises depositing a blanket layer, and performing an anisotropic etching process on the blanket layer. In an embodiment, the forming the mask strip comprises: depositing a template layer over the plurality of mask groups, wherein the template layer has a top surface higher than top surfaces of the plurality of mask groups; forming an opening in the template layer, wherein at least two of the plurality of mask groups are revealed through the opening; filling the opening to form the mask strip; and removing the template layer. In an embodiment, the method further comprises reducing a top surface of the mask strip to be level with or lower than the top surfaces of the plurality of mask groups. In an embodiment, the reducing the top surface of the mask strip comprises: polishing the mask strip; and after the polishing, etching-down the mask strip. In an embodiment, the plurality of conductive features have lengthwise directions aligned to a straight line, and the plurality of conductive features comprises an end strip comprising a first end and a second end, wherein the first end is curved and has a first radius, and the second end is curved and has a second radius smaller than the first radius. In an embodiment, a ratio of the first radius to the second radius is greater than about 2.0. In an embodiment, the depositing the dielectric layer comprises depositing a low-k dielectric layer.

In accordance with some embodiments of the present disclosure, a structure comprises a semiconductor substrate; a dielectric layer over the semiconductor substrate; a first conductive feature comprises: a first end, wherein the first end is curved, and has a first radius; and a second end opposing to the first end, wherein the second end is curved, and has a second radius smaller than the first radius; a second conductive feature spaced apart from the first end of the first conductive feature by a first part of the dielectric layer, wherein the second conductive feature has a first distance from the first end; and a third conductive feature spaced apart from the second end of the first conductive feature by a second part of the dielectric layer, wherein the third conductive feature has a second distance from the second end, and the second distance is smaller than the first distance, and wherein the first conductive feature, the second conductive feature, and the third conductive feature having lengthwise directions aligned to a same straight line. In an embodiment, a ratio of the first radius to the second radius is greater than about 2.0. In an embodiment, the first conductive feature has a first sidewall and a second sidewall opposing to the first sidewall, and the first conductive feature comprises a diffusion barrier and a metallic material over the diffusion barrier, and the diffusion barrier extends underlying the metallic material, and the first sidewall of the first conductive feature comprises a sidewall of a vertical portion of the diffusion barrier, and the metallic material extends to the second sidewall. In an embodiment, the first conductive feature has a first sidewall and a second sidewall opposing to the first sidewall, wherein in a first cross-sectional view of the structure, the first sidewall and the second sidewall tilt to a same direction. In an embodiment, the structure further comprises a fourth conductive feature in the dielectric layer, wherein the fourth conductive feature comprises two pairs of opposing sidewalls, and wherein each pair in the two pairs of opposing sidewalls tilt to opposing directions. In an embodiment, the first conductive feature and the second conductive feature comprise metal gate stacks. In an embodiment, the first conductive feature and the second conductive feature comprise source/drain contact plugs. In an embodiment, the structure further comprises a gate spacer physically contacting both of the first conductive feature and the second conductive feature. In an embodiment, the first conductive feature and the second conductive feature comprise metal lines, and wherein the dielectric layer comprises a low-k dielectric material.

In accordance with some embodiments of the present disclosure, a structure comprises a plurality of conductive features having lengthwise directions aligned to a same straight line, wherein the plurality of conductive features comprises a first end feature, a second end feature, and at least one middle conductive feature between the first end feature and the second end feature, and the first end feature comprising: a first end facing away from the second end feature, wherein the first end have first corners; and a second end facing toward the second end feature, wherein the second end have second corners sharper than the first corners; and a dielectric layer, wherein upper portions of the plurality of conductive features are in the dielectric layer. In an embodiment, each of the least one middle conductive feature comprises a third end facing toward the first end feature, and a fourth end facing toward the second end feature, and wherein both of the third end and fourth end are sharper than the first end of the first end feature. In an embodiment, the structure further comprises isolation regions between the plurality of conductive features, wherein the isolation regions are formed of a first dielectric material different from a second dielectric material of the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
depositing a dielectric layer;
depositing a plurality of mandrel strips over the dielectric layer;
forming a plurality of spacers on sidewalls of the plurality of mandrel strips to form a plurality of mask groups, wherein each of the plurality of mandrel strips and two of the plurality of spacers form a mask group in the plurality of mask groups;
forming a mask strip connecting two neighboring mask groups in the plurality of mask groups;
reducing a top surface of the mask strip to be level with or lower than top surfaces of the plurality of mask groups, wherein the reducing the top surface of the mask strip comprises:
polishing the mask strip; and
after the polishing, etching down the mask strip;
using the plurality of mask groups and the mask strip collectively as an etching mask to etch the dielectric layer, and to form trenches in the dielectric layer; and
filling a conductive material into the trenches to form a plurality of conductive features.

2. The method of claim 1, wherein the forming the plurality of spacers comprises depositing a blanket layer, and performing an anisotropic etching process on the blanket layer.

3. The method of claim 1, wherein the forming the mask strip comprises:
- depositing a template layer over the plurality of mask groups, wherein the template layer has a top surface higher than the top surfaces of the plurality of mask groups;
- forming an opening in the template layer, wherein at least two of the plurality of mask groups are revealed through the opening;
- filling the opening to form the mask strip; and
- removing the template layer.

4. The method of claim 1, wherein the plurality of conductive features have lengthwise directions aligned to a straight line, and the plurality of conductive features comprises an end strip comprising a first end and a second end, wherein the first end is curved and has a first radius, and the second end is curved and has a second radius smaller than the first radius.

5. The method of claim 4, wherein a ratio of the first radius to the second radius is greater than about 2.0.

6. The method of claim 1, wherein the depositing the dielectric layer comprises depositing a low-k dielectric layer.

7. The method of claim 1, wherein the top surface of the mask strip is reduced to be level with the top surfaces of the plurality of mask groups.

8. The method of claim 1, wherein the top surface of the mask strip is reduced to be lower than the top surfaces of the plurality of mask groups.

9. The method of claim 5, wherein the ratio of the first radius to the second radius is greater than about 3.0.

10. The method of claim 4, wherein the first end is continuously curved, and the second end comprises two curved corner portions and a substantially straight portion connected the two curved corner portions.

11. A method comprising:
- forming a dielectric layer;
- etching the dielectric layer to form openings; and
- forming a plurality of conductive features, with at least upper portions of the conductive features filling the openings in the dielectric layer, wherein the plurality of conductive features have lengthwise directions aligned to a same straight line, wherein the plurality of conductive features comprise a first end feature, a second end feature, and at least one middle conductive feature between, and physically separated from, the first end feature and the second end feature, and the first end feature comprising:
  - a first end facing away from the second end feature, wherein the first end have first corners; and
  - a second end facing toward the second end feature, wherein the second end have second corners sharper than the first corners.

12. The method of claim 11, further comprising forming an etching mask comprising:
- a spacer forming a ring encircling an additional opening, the spacer comprising a first material; and
- a mask strip separating the opening into a first portion and a second portion, wherein the mask strip is formed of a second material different from the first material; and
- etching the dielectric layer to transfer the first portion and the second portion of the opening into the dielectric layer, wherein the spacer and the mask strip are used collectively as parts of a corresponding etching mask.

13. The method of claim 12, wherein the spacer has a first height, and the mask strip has a second height lower than the first height.

14. The method of claim 12, wherein the spacer encircle a mandrel, and the mandrel is also a part of the corresponding etching mask.

15. A method comprising:
- depositing a dielectric layer;
- depositing a plurality of mandrel strips over the dielectric layer;
- forming a plurality of spacers on sidewalls of the plurality of mandrel strips to form a plurality of mask groups, wherein each of the plurality of mandrel strips and two of the plurality of spacers form a mask group in the plurality of mask groups;
- forming a mask strip connecting two neighboring mask groups in the plurality of mask groups, wherein the forming the mask strip comprises:
  - depositing a template layer over the plurality of mask groups, wherein the template layer has a top surface higher than top surfaces of the plurality of mask groups;
  - forming an opening in the template layer, wherein at least two of the plurality of mask groups are revealed through the opening;
  - filling the opening to form the mask strip; and
  - removing the template layer;
- using the plurality of mask groups and the mask strip collectively as an etching mask to etch the dielectric layer, and to form trenches in the dielectric layer; and
- filling a conductive material into the trenches to form a plurality of conductive features.

16. The method of claim 15, wherein the forming the plurality of spacers comprises depositing a blanket layer, and performing an anisotropic etching process on the blanket layer.

17. The method of claim 15, further comprising, reducing a top surface of the mask strip to be level with or lower than the top surfaces of the plurality of mask groups.

18. The method of claim 17, wherein the top surface of the mask strip is reduced to be level with top surfaces of the plurality of mask groups.

19. The method of claim 17, wherein the reducing the top surface of the mask strip comprises:
- polishing the mask strip; and
- after the polishing, etching-down the mask strip.

20. The method of claim 15, wherein the plurality of conductive features have lengthwise directions aligned to a straight line, and the plurality of conductive features comprises an end strip comprising a first end and a second end, wherein the first end is curved and has a first radius, and the second end is curved and has a second radius smaller than the first radius.

* * * * *